United States Patent
Gentile et al.

(10) Patent No.: US 8,879,670 B2
(45) Date of Patent: Nov. 4, 2014

(54) FLEXIBLE CHANNEL DECODER

(75) Inventors: Giuseppe Gentile, Leiden (NL);
Massimo Rovini, Putignano Pisa (IT);
Paolo Burzigotti, Katwijk (NL); Luca Fanucci, Montecatini Terme (IT)

(73) Assignee: Agence Spatiale Europeenne, Paris (FR)

( * ) Notice: Subject to any disclaimer, the term of this patent is extended or adjusted under 35 U.S.C. 154(b) by 0 days.

(21) Appl. No.: 12/990,721

(22) PCT Filed: Sep. 8, 2010

(86) PCT No.: PCT/IB2010/002537
§ 371 (c)(1),
(2), (4) Date: Dec. 6, 2011

(87) PCT Pub. No.: WO2012/032371
PCT Pub. Date: Mar. 15, 2012

(65) Prior Publication Data
US 2013/0156133 A1    Jun. 20, 2013

(51) Int. Cl.
*H04L 27/06*    (2006.01)

(52) U.S. Cl.
USPC ........... 375/340; 714/702; 714/755; 712/208; 712/221

(58) Field of Classification Search
CPC .............. H03M 13/2957; H03M 13/1117; H03M 13/6561; H03M 13/1102; H03M 13/1111; H03M 13/6393; H03M 13/6513; H03M 13/1105; H03M 13/116; H03M 13/2775; H03M 13/6566; H03M 13/6508; H03M 13/2978; H03M 13/3905; H03M 13/111; H03M 13/6569; H04L 1/005; H04L 25/03171; H04L 1/0071

USPC ............................ 714/755, 702, 786; 375/340
See application file for complete search history.

(56) References Cited

U.S. PATENT DOCUMENTS 6,023,783 A * 2/2000 Divsalar et al. ............... 714/792
6,189,126 B1 * 2/2001 Ulmer et al. .................. 714/795
(Continued)

FOREIGN PATENT DOCUMENTS

WO    WO 2008153436 A1 * 12/2008  ............ H03M 13/29
WO    WO 2009043918 A2 * 4/2009  ............ H03M 13/11

OTHER PUBLICATIONS

S. Yang and J. Cavallaro, "A Flexible LDPC/Turbo Decoder Architecture" J Sign Process Syst (2011) (Published Online: Apr. 9, 2010) pp. 11-16.*

(Continued)

*Primary Examiner* — Daniel Washburn
*Assistant Examiner* — Amneet Singh
(74) *Attorney, Agent, or Firm* — Alston & Bird LLP

(57) ABSTRACT

A configurable Turbo-LDPC decoder having A set of P>1 Soft-Input-Soft-Output decoding units ($DP_0$-$DP_{P-1}$; $DP_i$) for iteratively decoding both Turbo- and LDPC-encoded input data, each of the decoding units having first ($I_1^i$) and second ($I_2^i$) input ports and first ($O_1^i$) and second ($O_2^i$) output ports for intermediate data; First and second memories (M1, M2) for storing the intermediate data, each of the first and second memories comprising P independently readable and writable memory blocks having respective input and output ports; and A configurable switching network (SN) for connecting the first input and output ports of the decoding units to the output and input ports of the first memory, and the second input and output ports of the decoding units to the output and input ports of the second memory.

17 Claims, 22 Drawing Sheets

(56) References Cited

U.S. PATENT DOCUMENTS

| | | | |
|---|---|---|---|
| 6,865,710 B2* | 3/2005 | Bickerstaff et al. | 714/796 |
| 7,016,440 B1* | 3/2006 | Singer et al. | 375/350 |
| 7,117,418 B2* | 10/2006 | Thesling et al. | 714/755 |
| 7,219,288 B2* | 5/2007 | Dielissen et al. | 714/752 |
| 7,373,585 B2* | 5/2008 | Yedidia et al. | 714/786 |
| 7,831,894 B2* | 11/2010 | Lee et al. | 714/794 |
| 7,844,877 B2* | 11/2010 | Litsyn et al. | 714/752 |
| 7,934,147 B2* | 4/2011 | Lakkis | 714/800 |
| 7,971,131 B1* | 6/2011 | Ordentilch et al. | 714/786 |
| 8,086,931 B2* | 12/2011 | Litsyn et al. | 714/752 |
| 8,127,214 B2* | 2/2012 | Trofimenko et al. | 714/786 |
| 8,181,083 B2* | 5/2012 | Rovini et al. | 714/758 |
| 8,234,537 B2* | 7/2012 | Pavlov et al. | 714/752 |
| 8,279,954 B2* | 10/2012 | Papadopoulos et al. | 375/260 |
| 8,291,285 B1* | 10/2012 | Varnica et al. | 714/752 |
| 8,301,983 B2* | 10/2012 | Efimov et al. | 714/780 |
| 8,325,840 B2* | 12/2012 | Bursalioglu et al. | 375/267 |
| 8,375,272 B2* | 2/2013 | Litsyn et al. | 714/758 |
| 8,451,951 B2* | 5/2013 | Caire et al. | 375/340 |
| 2002/0124223 A1* | 9/2002 | Thesling et al. | 714/758 |
| 2003/0208716 A1* | 11/2003 | Wolf | 714/796 |
| 2004/0052144 A1* | 3/2004 | Berens et al. | 365/221 |
| 2004/0181406 A1* | 9/2004 | Garrett et al. | 704/242 |
| 2005/0050426 A1* | 3/2005 | Andreev et al. | 714/755 |
| 2005/0138520 A1* | 6/2005 | Richardson | 714/755 |
| 2005/0149838 A1* | 7/2005 | Chiueh et al. | 714/795 |
| 2005/0281111 A1* | 12/2005 | Urard et al. | 365/221 |
| 2006/0083174 A1* | 4/2006 | Shim et al. | 370/245 |
| 2006/0085726 A1* | 4/2006 | Rhee et al. | 714/784 |
| 2006/0156167 A1* | 7/2006 | Dielissen et al. | 714/752 |
| 2006/0161830 A1* | 7/2006 | Yedidia et al. | 714/786 |
| 2006/0224935 A1* | 10/2006 | Cameron et al. | 714/752 |
| 2007/0044006 A1* | 2/2007 | Yang et al. | 714/785 |
| 2007/0089018 A1* | 4/2007 | Tang et al. | 714/752 |
| 2007/0124652 A1* | 5/2007 | Litsyn et al. | 714/776 |
| 2007/0234184 A1* | 10/2007 | Richardson | 714/780 |
| 2007/0283220 A1* | 12/2007 | Kim | 714/758 |
| 2008/0052594 A1* | 2/2008 | Yedidia et al. | 714/758 |
| 2008/0123781 A1* | 5/2008 | Pisek et al. | 375/340 |
| 2008/0172590 A1* | 7/2008 | Shen et al. | 714/755 |
| 2008/0247442 A1* | 10/2008 | Orlik et al. | 375/138 |
| 2009/0037791 A1* | 2/2009 | Pavlov et al. | 714/752 |
| 2009/0160686 A1* | 6/2009 | Wong et al. | 341/81 |
| 2009/0217124 A1* | 8/2009 | Litsyn et al. | 714/752 |
| 2009/0276682 A1* | 11/2009 | Lakkis | 714/752 |
| 2009/0285323 A1* | 11/2009 | Sundberg et al. | 375/267 |
| 2009/0319873 A1* | 12/2009 | Doi et al. | 714/777 |
| 2010/0040163 A1* | 2/2010 | Caire et al. | 375/261 |
| 2010/0146360 A1* | 6/2010 | Trofimenko et al. | 714/752 |
| 2010/0146371 A1* | 6/2010 | Efimov et al. | 714/780 |
| 2010/0169737 A1* | 7/2010 | Litsyn et al. | 714/752 |
| 2010/0235718 A1* | 9/2010 | Yang et al. | 714/780 |
| 2010/0268918 A1* | 10/2010 | Priewasser et al. | 712/208 |
| 2010/0284497 A1* | 11/2010 | Toyama et al. | 375/340 |
| 2011/0110449 A1* | 5/2011 | Ramprashad et al. | 375/261 |
| 2011/0182329 A1* | 7/2011 | Wehinger | 375/148 |
| 2011/0276856 A1* | 11/2011 | Litsyn et al. | 714/752 |
| 2012/0159282 A1* | 6/2012 | Ito | 714/758 |

OTHER PUBLICATIONS

C. Berrou, A. Glavieux, and P. Thitimajshima, "Near shannon limit error—correcting coding and decoding: Turbo codes," in IEEE international conference on communications, vol. 2, May 1993, pp. 1064-1070.*

M. Rovini, G. Gentile, F. Rossi, and L. Fanucci, "A scalable decoder architecture for IEEE 802.11n LDPC codes," in Global Communication Conference, GL0BEC0M07, Nov. 2007.*

T. Brack, M. Alles, F. Kienle, and N. Wehn, "A synthesizable IP core for WiMAX 802.16e LDPC code decoding," in 17th IEEE Intern. Symp. on Personal, Indoor and Mobile Communic., Sep. 2006, pp. 1-5.*

M. Bickerstaff, D. Garrett, T. Prokop, B. Thomas, C. Widdup, L. Gongyu Zhou Davis, G. Woodward, C. Nicol, and R.-H. Yan, "A unified turbo/viterbi channel decoder for 3GPP mobile wireless in 0.18-μm cmos," IEEE J. Solid-State Circuits, vol. 37, pp. 1555-1564, Nov. 2002. (Pubitemid 35432178.*

C. Lin, C. Chen, and A. Wu, "High-throughput 12-mode CTC decoder for WiMAX standard" in IEEE Intern. Symp. on VLSI Design, Autom. and Test. VLSI-DAT 2008, 2008, pp. 216-219.*

G. Masera, F. Quaglio, and F. Vacca, "Implementation of a flexible LDPC decoder" vol. 54, No. 6, pp. 542-546, Jun. 2007.*

M. Martina, M. Nicola, and G. Masera, "A flexible umts-wimax turbo decoder architecture" IEEE Transaction on Circuit and System, Express Briefs, vol. 55, No. 4, pp. 369-373, Apr. 2008.*

M. Alles, T. Vogt, and N. When, "FlexiChaP: A reconfigurable ASIP for convolutional, turbo, and LDPC code decoding," in IEEE 5th Intern. Symp. on Turbo Codes and Related Topics, Sep. 2008, pp. 84-89.*

F. Naessens, B. Bougard, S. Bressinck, L. Hollevoet, P. Raghavan, L. Van Der Perre, and F. Catthoor, "A unified instruction set programmable architecture for multi-standard advanced forward error correction" in IEEE Workshop on Signal Proc. Syst., SiPS 2008, Oct. 2008, pp. 31-36.*

S. Yang and J. Cavallaro, "Unified decoder architecture for LDPC/turbo codes," in IEEE Workshop on Signal Processing Systems, SiPS 2008, Oct. 2008, pp. 13-18.*

M. Rovini, G. Gentile, and L. Fanucci, "A flexible state-metric recursion unit for a multi-standard BCJR decoder," in 2009 3rd Intern. Conf. on Signals, Circuits and Systems (SCS), 11 2009, pp. 1-6.*

A. Tarable, S. Benedetto, and G. Montorsi, "Mapping interleaving laws to parallel turbo and ldpc decoder architectures," IEEE Transaction on Information Theory, vol. 50, No. 9, pp. 2002-2009, Sep. 2004.*

* cited by examiner

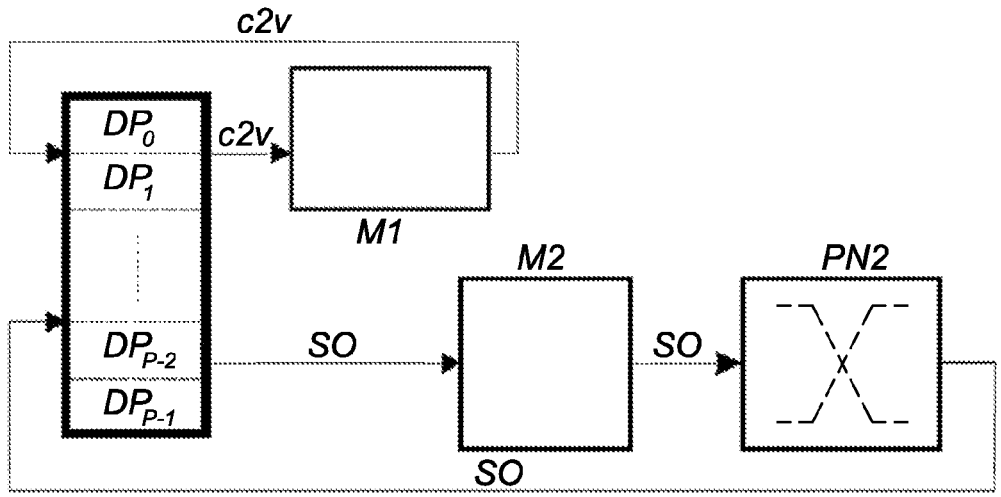
*Fig. 6C*
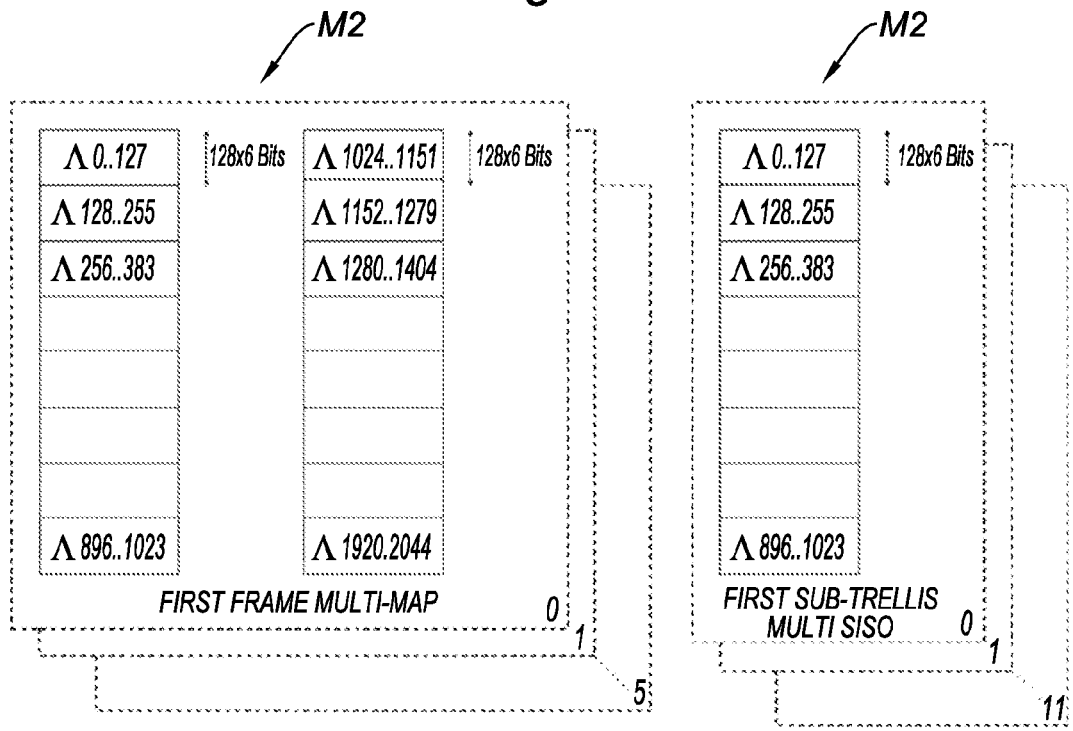
*Fig. 7A1*  *Fig. 7A2*

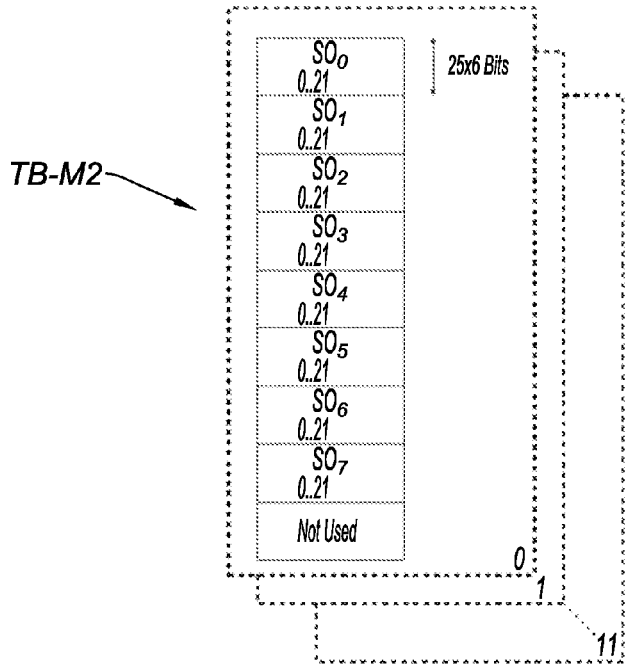
Fig. 8C
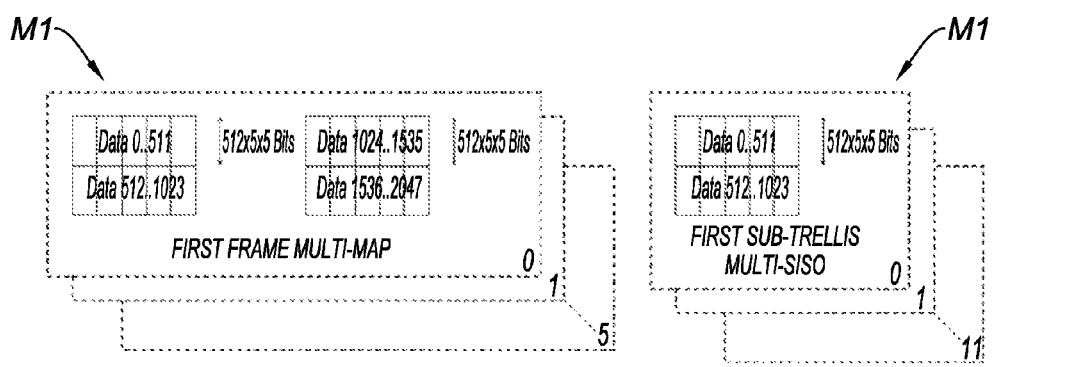
Fig. 9A1          Fig. 9A2
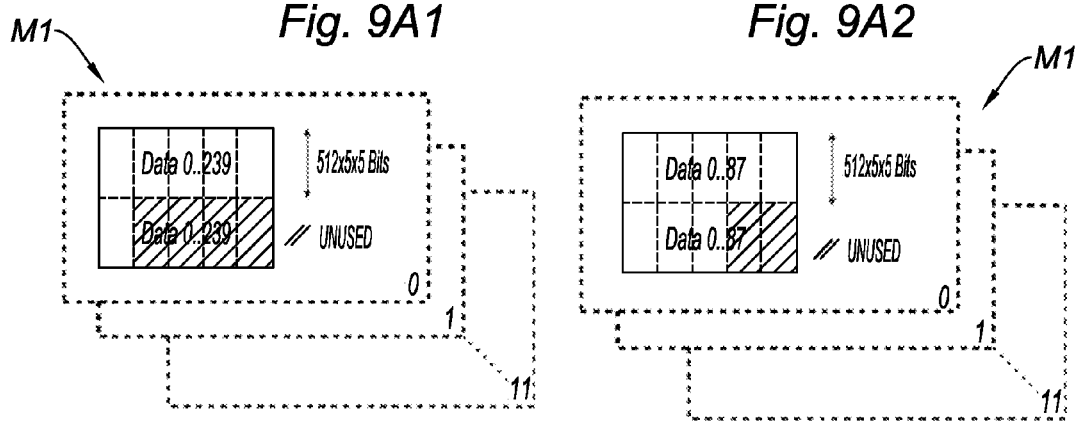
Fig. 9B          Fig. 9C A : Binary Frame 1
B : Binary Frame 2

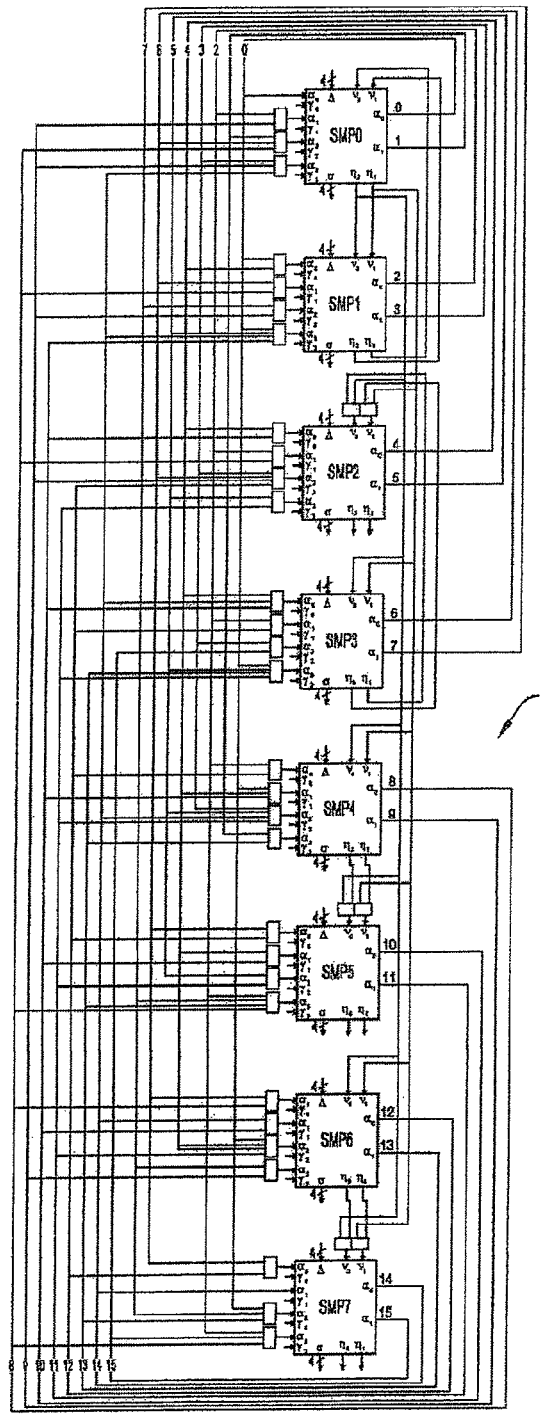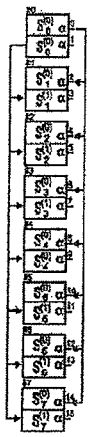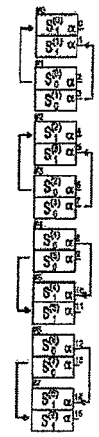
Fig. 18B　　Fig. 18C　　Fig. 18D
Fig. 18A

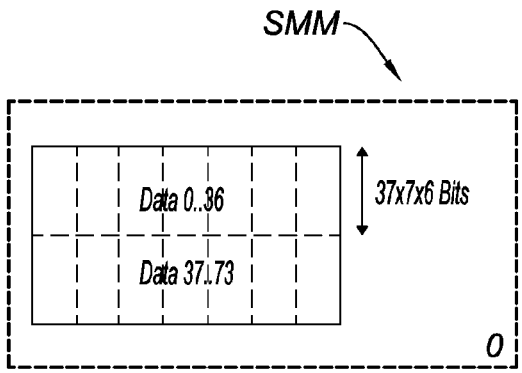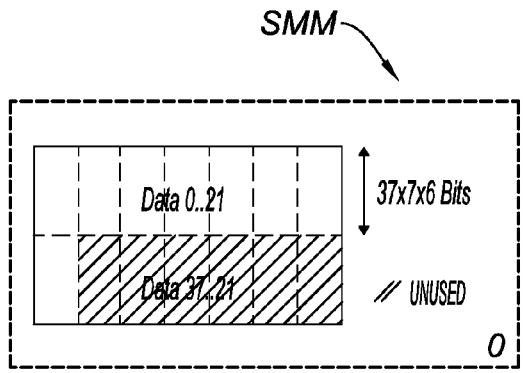
Fig. 20A   Fig. 20B
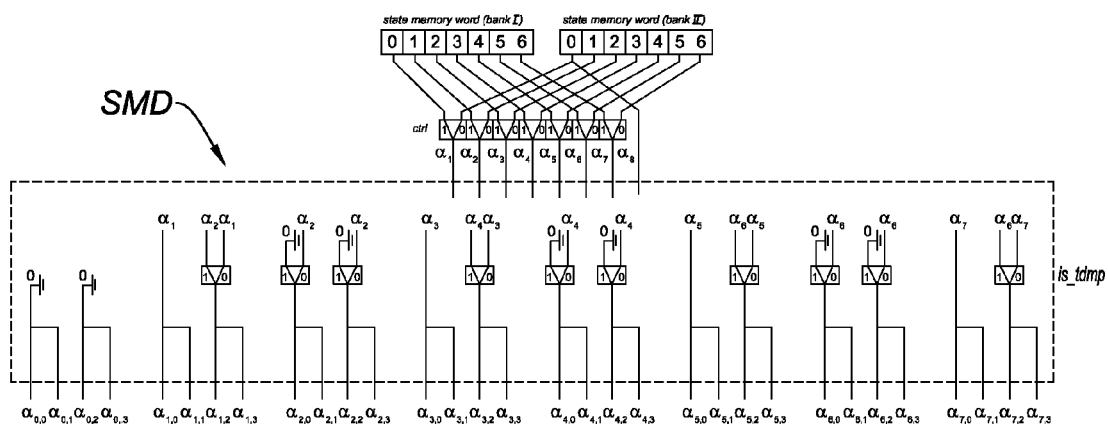
Fig. 21
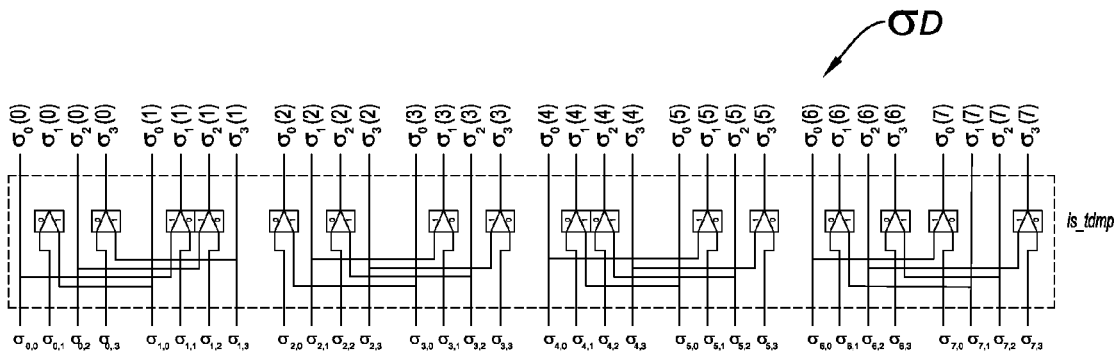
Fig. 22

A : Binary Frame 1
B : Binary Frame 2

FLEXIBLE CHANNEL DECODER

FIELD OF THE INVENTION

The invention relates to a flexible and configurable channel decoder suitable for decoding both Turbo codes and Low Density Parity Check (LDPC) codes, which are widely used in modern communication standards due to their remarkable error correction performances. Within this context, a decoder is considered "flexible" when it is compliant with different standard, characterized by different coding algorithm (Turbo- or LDPC), frame lengths, throughput and latency requirements.

BACKGROUND OF THE INVENTION

Nowadays the demand of multi-standard applications has become a must for the worldwide user. In such a scenario, a wide range of contents can be provided by integrating onto the same device the support of different communication protocols, both satellite and terrestrial. Flexibility is then the keyword in the design of modern modems and particular attention must be paid to the implementation of the advanced channel coding techniques which represents the most challenging task in terms of computational complexity, speed and power consumption. Indeed, particularly for mobile devices, flexibility has to be combined with low complexity and power consumption.

The evolution of the mobile phone market represents a valuable example of this overwhelming trend. Born exclusively for voice services, it has quickly grown up embracing different data services such as Short-Message-Service (SMS), Multimedia-Messaging-Service and Wireless-Application-Protocol (WAP) internet connections. Nowadays, modern "smartphones" are designed to be capable of connecting to high speed cellular networks for mobile internet (3GPP-HSPA, 3GPP-LTE), high speed wireless local and metropolitan area networks for wireless internet connections (IEEE 802.11n, IEEE 802.16e) and satellite networks to receive broadcast video and multimedia contents (DVB-SH). This wide range of applications demands ever-increasing data rates and high reliability so as to guarantee an adequate Quality of Service (QoS). Channel coding is an effective method to improve the communication performances and, among the possible candidates, low-density parity-check (LDPC) and Turbo codes are regarded as excellent solutions for advanced forward error correction (FEC).

LDPC codes were first discovered by Gallager in 1960 but, despite the remarkable error correction performance, they were soon given up as their decoding complexity was too high with respect to the computation capabilities of the time. Recently, the impressive improvement of the micro-electronics technology having made the decoding complexity manageable, LDPC codes have become one of the most hot research topic in the field of communication systems. At the same time, the industrial attention to the LDPC codes has widely grown to such an extent that they have been included in several communication standards; namely the Digital Video Broadcasting Satellite Second generation DVB-S2, the second generation digital transmission system for cable and terrestrial systems DVB-C2 and DVB-T2, as well as IEEE 802.11n, IEEE 802.16e and IEEE 802.3an for new generation Ethernet connections.

Turbo codes were invented by Berrou in 1993 and have proved to be very effective forward error correcting codes featuring performance very close to the theoretical Shannon limit. The strength point of this invention was the introduction of the iterative decoding of the constituent convolutional codes. Nowadays, the Turbo code scheme is the preferred choice of many communication standards, such as, the $3^{rd}$ generation partnership project standards (3GPP-UMTS, 3GPP-HSPA and 3GPP-LTE), the Digital video Broadcasting-Service to Handheld (DVB-SH), the Digital Video Broadcasting-return channel via satellite (DVB-RCS) and the IEEE 802.16e.

An advanced FEC channel decoder is often the most computational demanding block of the whole transceiver and consequently represents the bottleneck in terms of hardware-complexity, achievable data-rate and power consumption. Moreover the channel decoder must be compliant with all the communication standards specified by the particular device. In this sense, flexibility, i.e. the capability of supporting different communication standards with the minimum software/hardware utilization, represents the driving factor to keep complexity, latency and power consumption under control.

The most straightforward solution to attain flexibility is the design of one separated core for each channel decoding scheme (either LDPC or Turbo Codes or both) defined by all the communication standards to be supported. Although optimized in terms of data-rate and error correction performances, this approach is very demanding in terms of area and power consumption thus violating the strict budget of a mobile/portable device.

As an alternative way, it is possible to design two different cores implementing a Turbo and a LDPC flexible decoder architecture, respectively. Each core must be designed to be compliant with all the required standards, and commonalities between different code classes must be identified in order to efficiently share hardware resources and reduce the overall complexity. In this regard, Masera et al. proposes a flexible LDPC decoder compliant with IEEE 802.11n and IEEE 802.16e [1] and Lee et al. designed a flexible unified LDPC decoder architecture capable of supporting IEEE 802.11n, IEEE 802.16e and DVB-S2 [2]. As far as Turbo decoding is concerned, it is also worth mentioning the Flexible binary/duo-binary Turbo decoder architecture compliant with UMTS and IEEE 802.16e by Martina et al. [3] and the parallel radix-4 Turbo decoder for IEEE 802.16e and 3GPP-LTE by Kim et al. [4]. This last strategy allows a considerable reduction of the overall channel decoding platform complexity and power consumption; however it still requires two separate cores making it unsuitable for application where very strict area and power constraints are demanded, like in small mobile devices.

Application-Specific Instruction-set Processors (ASIP) allow the implementation of single-core flexible decoders. They are programmable circuits (processors) wherein a dedicated instruction-set is directly mapped on optimized hardware for improved performances. This optimized software/hardware configuration, tailored for the specific application, allows an high degree of flexibility with relatively low complexity. As an example, Alles at al. purpose the so-called FlexiChaP architecture [5], capable of supporting binary/duo-binary turbo codes as well as LDPC codes for IEEE 802.11n and IEEE 802.16e with a chip area of only 0.622 mm² using a 65 nm CMOS technology. The key of such a design is the identification of common hardware resources that can be re-used among different decoding schemes and efficiently mapped into a software instruction. Another interesting ASIP channel decoding platform is proposed by Naessens et al. [6, 7] where the support of the IEEE 802.16e and IEEE 802.11n codes is achieved with a chip area of 0.96 mm2 using a 45 nm CMOS technology. The main drawback of this approach is the achievable data-rate (throughput) and the power consumption. Actually due to the very low hardware complexity, all the decoding steps must be performed in a time division manner. Consequently, in order to reduce the decoding time, the operating clock frequency is generally high with a considerable increase in the overall power consumption. As an example in [5] the operating clock frequency was pushed to 400 MHz and the attainable throughput was anyway not enough to fully support the IEEE 802.16e standard.

Joint minimization of hardware complexity and power consumption under demanding throughput constraints can only be achieved by an ASIC (Application Specific Integrated Circuit) implementation. Cavallaro et al. describes a preliminary ASIC flexible decoding architecture supporting both Turbo and LDPC codes [8]; however, such an architecture is not used to implement a Multi-Standard decoder but different ad-hoc single-standard solutions. Trofimenko et al. [9] disclose a "unified" decoder capable of supporting Turbo, LDPC and convolutional codes with a single core. However, this core is not optimized in terms of hardware complexity. Moreover, the critical issue of standard-dependent parallelization is not discussed. Three of the present inventors (Massimo Rovini, Giuseppe Gentile and Luca Fanucci) have disclosed an ASIC-implemented state-metric recursive unit, usable for both Turbo- and LDPC-decoding [10]. This unit, however, is only a component (albeit an important one) of a full flexible decoder.

SUMMARY OF THE INVENTION

The invention aims at providing a flexible Turbo/LDPC decoder overcoming all or part of the drawbacks of the cited prior art.

A configurable Turbo-LDPC decoder according to the invention comprises:
  A set of P>1 Soft-Input-Soft-Output decoding units for iteratively decoding both Turbo- and LDPC-encoded input data, each of said decoding units having first and second input ports and first and second output ports for intermediate data;
  First and second memories for storing said intermediate data, each of said first and second memories comprising P independently readable and writable memory blocks having respective input and output ports; and
  A configurable switching network for connecting the first input and output ports of said decoding units to the output and input ports of said first memory, and the second input and output ports of said decoding units to the output and input ports of said second memory.

This architecture allows implementing different parallelization schemes with minimal hardware overhead. Parallelization is important to achieve a high throughput, and different parallelization schemes have to be used when dealing with different communication standards. More particularly, the switching network of the inventive decoder allows the selective implementation of the following parallelization schemes:
  simultaneous decoding of several Turbo-encoded frames by at least some of said P decoding units;
  parallelized decoding of a single Turbo-encoded frame by at least some of said P decoding units; and
  parallelized decoding of a single LDPC-encoded frame by at least some of said P decoding units, each processing one or more parity-check constraints.

Advantageous embodiments of the inventive flexible decoder and of some of its sub-units constitute the subject-matter of the dependent claims.

Another object of the invention is a Soft-Input-Soft-Output Turbo- and LDPC-decoding unit having:
  a first input port for input reliabilities used in Turbo-decoding, and for check-to-variable metrics used in LDPC-decoding;
  a second input port for extrinsic reliabilities used in Turbo-decoding and for intermediate soft outputs used for LDPC-decoding;
  a first output port for check-to-variable metrics updated during LDPC-decoding; and
  a second output port for extrinsic reliabilities obtained as intermediate or final results of Turbo-decoding, and for soft outputs obtained as intermediate or final results of LDPC-decoding;
  said decoding unit comprising the following functional blocks:
    A by-passable channel cumulative computation unit for computing channel cumulative messages by adding-up input reliabilities;
    A state-metric recursive unit for successively performing recursive computation of forward- and backward metrics, taking said channel cumulative messages as inputs;
    A state-metric memory for storing already-computed forward metrics while the state-metric recursive unit is computing backward metrics, or vice-versa; and
    An extrinsic reliabilities processor for computing extrinsic reliabilities, for Turbo-decoding, and soft outputs and check-to-variable metrics, for LDPC decoding, taking said forward metrics, backward metrics and channel cumulative messages as its inputs.

Advantageously, said Soft-Input-Soft-Output Turbo- and LDPC-decoding unit can also comprise configurable distribution networks for transferring data from the input ports of the decoding units to its functional block, and between said functional blocks, according to different data formats and decoding algorithms.

Still another object of the invention is an extrinsic reliability processor for computing extrinsic reliabilities in Turbo-decoding, and soft outputs and check-to-variable metrics, in LDPC decoding, having input ports for forward metrics, backward metrics and channel cumulative messages corresponding to different trellis edges, and comprising:
  a first stage of adders, for adding forward, backward and channel cumulative messages corresponding to a same trellis edge;
  a number $2^M$ of max* or max trees equal to the number of said alphabet symbols;
  a number K of $2^M \times 2^M$ permutation networks equal to the number of said trellis states, connecting output ports of said adders to input ports of said max* or max trees, wherein each of said max* or max trees has K input ports, each one being connected to a different one of said permutation networks;
  a third stage of adders for computing extrinsic reliabilities as sums of outputs of said max* or max trees; and
  fourth and fifth stages of adders for computing updated check-to-variable metrics and LDPC-soft outputs by combining input and outputs of first stages of said max* or max trees.

Still another object of the invention is a state-metric recursive unit for performing recursive computation of forward- and backward metrics according to the BCJR algorithm, comprising a plurality of state metric processors for computing forward and backward metrics of respective states of a code trellis, interconnected by a configurable recursion network, each said state metric processor comprising:
  first input ports for receiving, through said recursion network, forward/backward metrics;

second input ports for receiving channel cumulative messages corresponding to different edges reaching a same state of a code trellis;

a first stage of adders, for adding forward, backward and channel cumulative messages corresponding to a same code symbol;

third input ports for receiving a posteriori reliabilities/Soft-outputs;

a second stage of adders, for adding said a posteriori reliabilities to the sums performed by the adders of said first stages;

a max* or max tree taking as inputs the sums computed by the adders of said second stage; and first output ports for updated values of said forward/backward metrics.

The Soft-Input-Soft-Output Turbo- and LDPC-decoding unit, the extrinsic processor and the state-metric recursive unit of the invention can be used as elements of a flexible Turbo/LDPC decoder as described above, but they can also be realized as independent devices (preferably implemented as ASICs) or as elements of other more complex devices.

BRIEF DESCRIPTION OF THE DRAWINGS

Additional features and advantages of the present invention will become apparent from the subsequent description, taken in conjunction with the accompanying drawings, which show:

FIGS. 6A, 6B and 6C, three different parallelization schemes which can be implemented using the architecture of FIG. 5;

FIGS. 7A1-9C, 20A and 20B, arrangements of the different memories of an exemplary decoder based on the architecture of FIG. 5;

FIGS. 10-19B, 21-27 and 31, preferred implementations of logic units forming said exemplary decoder;

DETAILED DESCRIPTION

Before describing the invention in detail, it will be necessary to recall some basic facts on Turbo- and LDPC-codes and on their decoding algorithms.

Figure 1A:
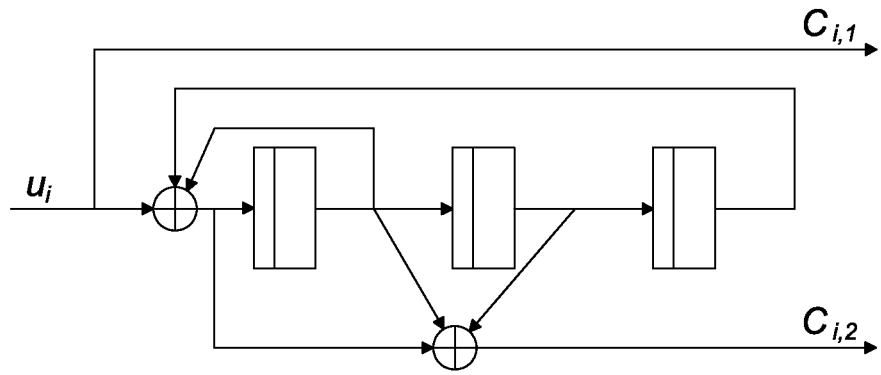
FIGS. 1A to 1C, the block diagrams of a Recursive Systematic Convolutional (RSC) error-correcting code, of a Parallel Concatenated Convolutional Code (PCCC), and of a Serial Concatenated Convolutional Code (SCCC), respectively.

The constituent block of a Turbo code is a recursive systematic convolutional code (RSC-code) which is produced by a linear feedback shift register. FIG. 1A shows an example of a binary RSC-code encoder with rate R=1/2, constraint length L=4, and generator vector equals to:

$$G = \left[1, \frac{1+D+D^2}{1+D+D^3}\right] \quad (1)$$

On the figure, $u_i$ represent the input bit sequence, and $c_{i,1}$, $c_{i,2}$ the generated code bits.

The rate of the code can be defined as the ratio between the number of the encoder input and output bits in a single time slot, while the constraint length equals the register number of the encoder plus 1. The generator vector of such an encoder features as many components as the number of output bits and indicates how to connect the input and the output of the registers to achieve the desired results. Particularly, in (1) the first output $c_{i,1}$ is merely short circuited with the input (systematic), while the second $c_{i,2}$ is the combination of a forward and a backward path. The forward path, represented by the numerator, involves the first, the second and the third tap (a tap is a connection feeding or coming out of a register) while the backward path, represented by the denominator, is the sum of the input, the second and the fourth tap.

Figure 1B:
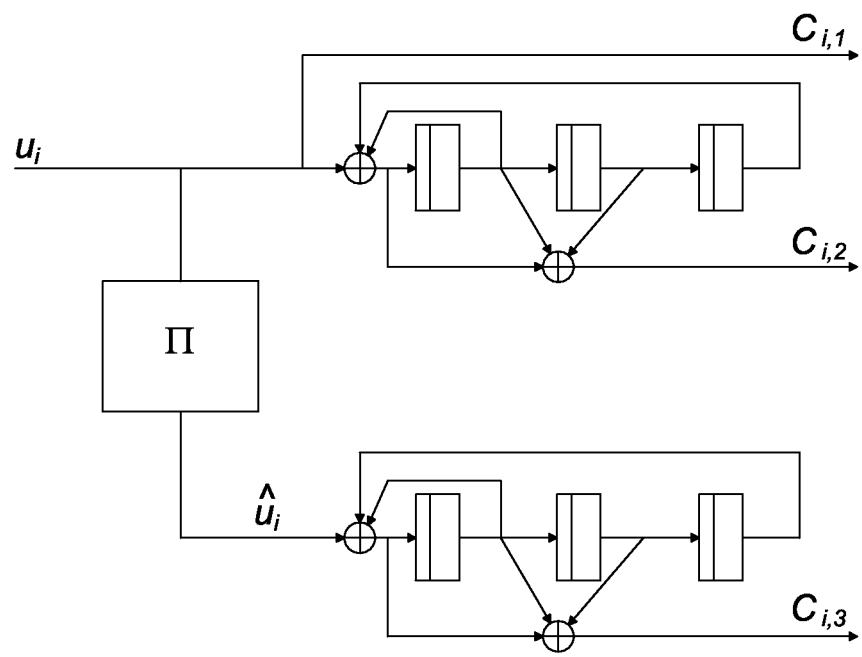

The most popular class of Turbo codes is the Parallel Concatenated Convolutional Codes (PCCC). FIG. 1B shows an example of such an encoder architecture which is composed of two RSC-code encoders (constituent encoders) plus an interleaver Π which feeds the second RSC-encoder with a different-ordered version $\hat{u}_i$ of the input sequence $u_i$.

Figure 1C:
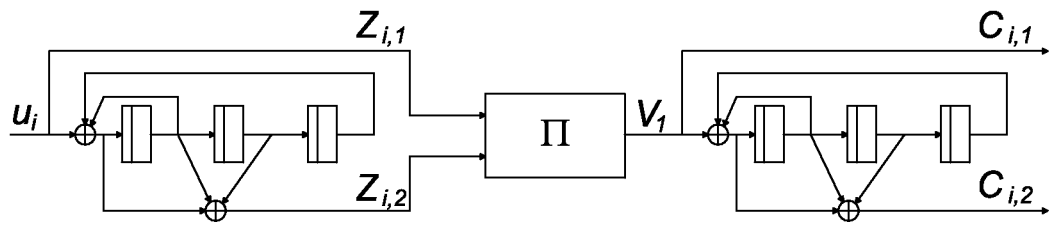

The other class of Turbo codes is the Serial Concatenated Convolutional Codes (SCCC). The architecture of the related encoder is shown in FIG. 1C and it is composed of two RSC encoders serially connected through an interleaver.

Turbo codes can be binary or M-binary. In the latter case, the constituent RSC codes are fed with an input symbol representing M>1 bits. In practice, only binary and duo-binary (M=2) codes are used, but this is not a fundamental limitation, and alphabets with more than $2^2$=4 symbols can also be used.

The turbo decoding algorithm reflects the encoder structure so it is composed of two "SISO" (Soft-Input-Soft-Output) decoding units, decoding the constituent RSC-code, iteratively exchanging information (through interleavers) to improve the reliability of the received codeword. Before going into details of the Turbo-decoding, it is expedient to recall the BCJR (Bahl, Cocke, Jelinek and Raviv) algorithm, used for decoding the constituent RSC codes. As it will be discussed further, the BCJR can also be used for decoding LDPC codes, making it particularly useful for the realization of a flexible decoder.

Let us consider an (RSC) encoder fed by an information word $u_0, u_1, \ldots, u_i, \ldots, u_{K-1}$ where each symbol $u_i$ is composed of M bits (M=1 in case of binary codes and M=2 in case of duo-binary codes). The encoder produces then an N-bit output codeword $c_0, c_1, \ldots, c_{N-1}$ with R=K·M/N the rate of the code. The BCJR algorithm provides the a-posteriori probabilities of the information symbol given the received codeword, in the Log-Likelihood Ratio (LLR) format $$\Lambda_i^{APO}(U) = \ln\frac{P(u_i = U \mid r)}{P(u_i = U_o \mid r)} \quad (2)$$

where U is one of the possible values of the input symbol $u_i$, $U_O$ is a value of the input symbol taken as a reference and r is the information available at the receiver after the transmission over the noisy channel.

Figure 2:
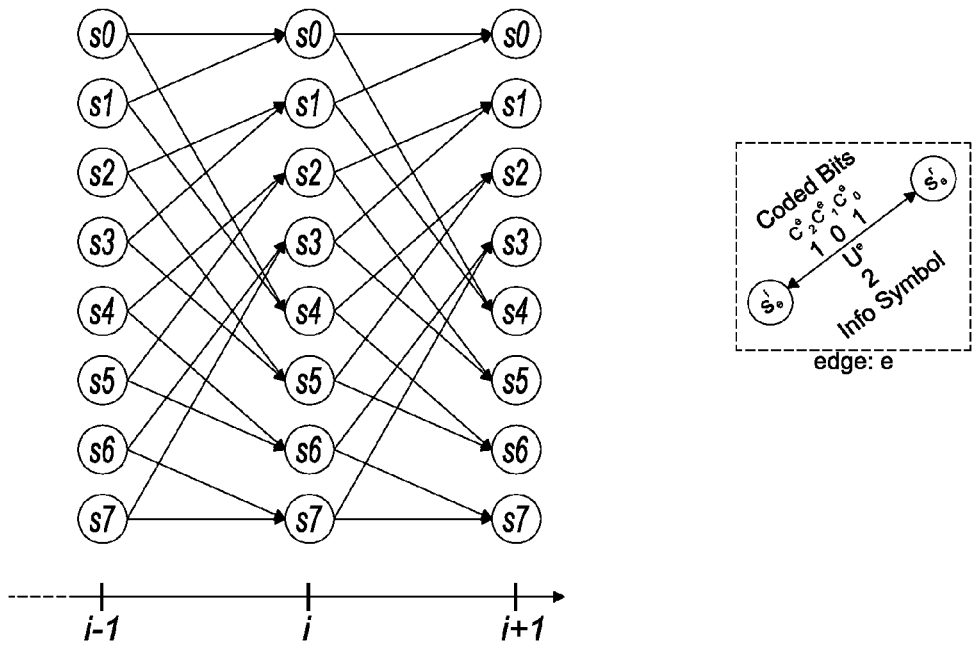
FIG. 2, an exemplary code trellis.

The operations of a convolutional encoder can be described by means of a particular graph, named trellis, tracking the evolution of the register states depending on the input symbol. Actually, the state of the encoder at the time i ($S_i$) and then its outputs ($c_i$), depends only on the state of the encoder at the previous time slot ($S_{i-1}$) and on the current information symbol ($U_i$). An example of trellis graph for an eight-state convolutional encoder is shown on FIG. 2.

The BCJR algorithm is based on the trellis representation of the encoding process, and the a-posteriori LLR of the information symbols can be evaluated as:

$$\Lambda_i^{APO}(U) = \ln \frac{\sum_{e:u_i=U} \alpha_i(S_e^l)\beta_{i+1}(S_e^r)P(u_i=U)\prod_n P(c_{i,n}=c_n^e)}{\sum_{e:u_i=U_0} \alpha_i(S_e^l)\beta_{i+1}(S_e^r)P(u_i=U_0)\prod_n P(c_{i,n}=c_n^e)} \quad (3)$$

Where "e: $u_i=U$" is the set of edges with the information symbol equal to U, $\alpha_i(S_e^l)$ is the "forward" metric of the state at the left of the considered edge (starting state), $\beta_{i+1}(S_e^r)$ is the "backward" metric of the state at the right of the considered edge (ending state), $P(u_i=U)$ is the probability of the information symbol and $$\prod_n P(c_{i,n}=c_n^e)$$

is the product of the probabilities of the coded bits associated to the edge whose number is equal to the number of output bits per clock cycle of the RSC encoder.

The forward (backward) metrics are evaluated by initializing the values at the beginning (end) of the trellis and by recursively proceeding through the trellis itself:

$$\begin{cases} \alpha_0(S) = \alpha_{init}(S) \\ \alpha_{i+1}(S) = \sum_{e:S^* \to S} \alpha_i(S^*)P(u_i=U^e)\prod_n P(c_{i,n}=c_n^e) \\ \beta_K(S) = \beta_{init}(S) \\ \beta_i(S) = \sum_{e:S^* \to S} \beta_{i+1}(S^*)P(u_i=U^e)\prod_n P(c_{i,n}=c_n^e) \end{cases} \quad (4)$$

where "e: $S^* \to S$" is the set of states at time i(i+1) connected to the state S at time i+1(i).

Initialization of equations (4) is made possible by the fact that Turbo codes are either terminated (initial and final state known) or circular (initial and final states unknown, but identical). It should be noted that $\alpha_i$ is computed starting from the first state $S_0$ of the code trellis ("forward recursion") while $\beta$ is computed starting from the last state $S_K$ of the trellis ("backward recursion"). Actually, $\beta$-recursion (the same is also true for $\alpha$-recursion) can also start from an unknown state $S_{K'}$ provided that it is sufficiently far than the state $S_i$ to be estimated. The first estimations of the metrics are poor, but after a few recursions ("training sequence") they become sufficiently reliable. This is important, as it allows subdividing a long trellis—corresponding to a long codeword—into smaller "sub-trellises" which can be processed serially or in parallel.

Equation (3) contains multiplications, which would substantially increase the implementation complexity. Therefore, it is useful to rewrite it using the LLR versions of the involved factors, and particularly $$\alpha_i^{LLR}(S) = \ln \frac{\alpha_i(S)}{\alpha_i(S_0)}, \beta_i^{LLR}(S) = \ln \frac{\beta_i(S)}{\beta_i(S_0)} \text{ and } \lambda_{i,n} = \ln \frac{P(c_{i,n}=1)}{P(c_{i,n}=0)}.$$

It can be shown that:

$$\Lambda_i^{APO}(U) = \quad (5)$$

$$\ln \frac{P(u_i=U)}{P(u_i=U_0)} \cdot \frac{\sum_{e:u_i=U} \exp\left(\alpha_i^{LLR}(S_e^l) + \beta_{i+1}^{LLR}(S_e^r) + \sum_n c_n^e \cdot \lambda_{i,n}\right)}{\sum_{e:u_i=U_0} \exp\left(\alpha_i^{LLR}(S_e^l) + \beta_{i+1}^{LLR}(S_e^r) + \sum_n c_n^e \cdot \lambda_{i,n}\right)}$$

where the factor $$\Lambda_i^{APR}(U) = \ln \frac{P(u_i=U)}{P(u_i=U_0)}$$

can be regarded as the a-priori reliability of the information symbol coming, in a Turbo decoding, from the neighbor convolutional "SISO" decoder.

Equation (5) can be written in a simpler form by using the "max*" operator:

$$\begin{cases} \max^*(a,b) = \ln(e^a+e^b) = \max(a,b) + \ln(1+e^{-|a-b|}) \\ \max^*(a,b,c) = \max^*(a,\max^*(b,c)) = \ln(1+e^a+e^b+e^c) \end{cases}$$

The final expression of the a-posteriori reliability is:

$$\Lambda_i^{APO}(U) = \Lambda_i^{APR}(U) + \max_{e:u_i=U}^* \left(\alpha_i^{LLR}(S_e^l) + \beta_{i+1}^{LLR}(S_e^r) + \sum_n c_n^e \cdot \lambda_{i,n}\right) - \quad (6)$$

$$\max_{e:u_i=U_0}^* \left(\alpha_i^{LLR}(S_e^l) + \beta_{i+1}^{LLR}(S_e^r) + \sum_n c_n^e \cdot \lambda_{i,n}\right).$$

In order to simplify the implementation, the "max*" operator can be replaced by the "max" operator.

The recursive expressions of the forward and backward metrics can also be rewritten in the LLR form using the max* (or max) operator:

$$\alpha_{i+1}^{LLR}(S) = \max_{e:S^* \to S}^* \left(\alpha_i^{LLR}(S^*) + U^e \cdot \Lambda_i^{APR}(U^e) + \sum_n c_n^e \cdot \lambda_{i,n}\right) - \quad (7)$$

$$\max_{e:S^* \to S_0}^* \left(\alpha_i^{LLR}(S^*) + U^e \cdot \Lambda_i^{APR}(U^e) + \sum_n c_n^e \cdot \lambda_{i,n}\right)$$

$$\beta_i^{LLR}(S) = \max_{e:S \to S^*}^* \left( \beta_{i+1}^{LLR}(S^*) + U^e \cdot \Lambda_i^{APR}(U^e) + \sum_n c_n^e \cdot \lambda_{i,n} \right) - \tag{8}$$

$$\max_{e:S_0 \to S^*}^* \left( \beta_{i+1}^{LLR}(S^*) + U^e \cdot \Lambda_i^{APR}(U^e) + \sum_n c_n^e \cdot \lambda_{i,n} \right).$$

Having briefly introduced the BCJR algorithm, it is now possible to discuss BCJR-based Turbo decoding.

The PCCC decoding algorithm iteratively exploits two BCJR algorithms to update the reliability of the transmitted word. Each BCJR (SISO) block belongs to the corresponding RSC encoder and exchanges "extrinsic" information with the other one. Let $\Lambda_{i-1,1 \to 2}^{APR}$ be the "extrinsic" information transmitted from SISO1 to SISO2 at the end of step i−1. SISO2 uses this information, together with the input reliability $\lambda_{i,n}$ coming from the channel, to compute the a-posteriori reliability $\Lambda_i'^{APO}$. The "extrinsic" information transmitted from SISO2 to SISO1, $\Lambda_{1,2 \to 1}^{APR}$ is obtained by subtracting from $\Lambda_i'^{APO}$ the extrinsic information SISO1→SISO2 and by applying permutation $\Pi^{-1}$ (the inverse of those performed by the encoding interleaver): $\Lambda_{i,2 \to i}^{APR} = \Pi^{-1}(\Lambda_i'^{APO} - \Lambda_{i-1,1 \to 2}^{APR})$. Then SISO1 uses this extrinsic information to compute, $\Lambda_i^{APO}$ and $\Lambda_{i,1 \to 2}^{APR}$, and so on. The exchanging of extrinsic information is the core of turbo decoding, and allows attaining convergence with a reasonable number of decoding iteration.

Figure 3A:
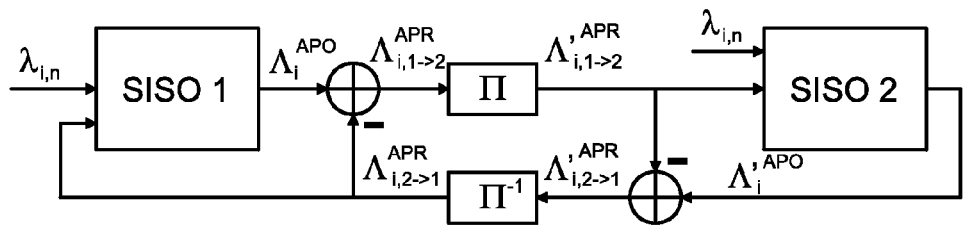
FIGS. 3A and 3B, the block diagrams of PCCC and SCCC decoding algorithms, respectively.

FIG. 3A shows the architecture of a PCCC turbo decoder. According to eq. (6) each SISO takes as input the reliabilities coming from the channel and the A-priori input reliabilities from the neighbor block. Due to the presence of the interleaver in the encoder, data must be shuffled according to the interleaver law to always guarantee the data consistency between the two BCJR blocks; reference Π indicates an interleaver equivalent to that used for encoding, $\Pi^{-1}$ the inverse interleaver. The decoding process runs then iteratively either for a fixed number of iteration or until convergence is reached. It is worth to note that in this context convergence means that the APP-LLRs output by each SISO are at least approximately equal and they do not change (or change slowly) with other iterations.

Figure 3B:
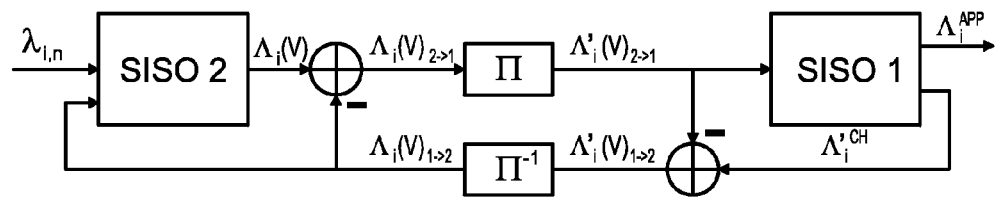

The architecture of a SCCC Turbo decoder is shown in FIG. 3B. Differently from the PCCC scheme the SISO1 decoder only receives the extrinsic reliabilities of the output bits $v_i$ (see FIG. 1C) as it is not directly interfaced with the channel. Nevertheless, besides the APP-LLR of each transmitted bit, SISO1 also computes the reliabilities of the intermediate codeword $v_k$ (the output of the first RSC-encoder) which is in turn feed to the SISO2 as "extrinsic" information. Within a SISO decoder the evaluation of the to LLR reliability associated to a generic RSC output bit $c_i$ can be performed similarly to eq. (6) as:

$$\Lambda_i^{CH}(c_k) = \tag{9}$$

$$\Lambda_i^{APR}(c_k) + \max_{e:c_k=1}^* \left( \alpha_i^{LLR}(S_e^l) + \beta_{i+1}^{LLR}(S_e^r) + \Lambda_i^{APO}(U^e) + \sum_{n \neq k} c_n^e \cdot \lambda_{i,n} \right) - $$

$$\max_{e:c_k=0}^* \left( \alpha_i^{LLR}(S_e^l) + \beta_{i+1}^{LLR}(S_e^r) + \Lambda_i^{APO}(U^e) + \sum_{n \neq k} c_n^e \cdot \lambda_{i,n} \right)$$

where $\Lambda_i^{CH}(c_k)$ is the A-posteriori reliability of the output bit $c_k$ at time i, $\Lambda_i^{APR}(c_k)$ the a-priori reliability received from the neighbor decoder, "e: $c_k=1$" is the set of edges with $c_k=1$ and $\Lambda_i^{APO}(U^e)$ is the a-posteriori reliability of the symbol associated to the edge e.

It is worth noting that the SISO decoders operate alternatively, and not simultaneously. Therefore, in actual hardware implementations, a single decoding unit plays the role of both SISO1 and SISO2.

LDPC codes are linear block codes which can be described with two different means: the parity check matrix and the tanner graph. More precisely, each codeword produced by a particular LDPC encoder x belongs to the null space of a corresponding parity check matrix H:

$$Hx^T = 0 \tag{10}$$

Figure 4A:
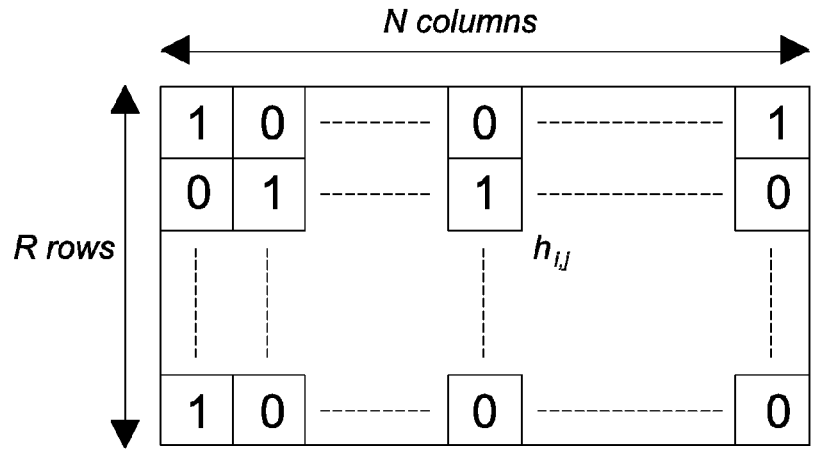
FIGS. 4A, 4B and 4C, examples of a Parity Check Matrix, of a Tanner graph representing a LDPC code and of the equivalent 2-state trellis of a LDPC check node.

The parity check matrix H (FIG. 4A) is a sparse matrix having a number of columns (N) equals to the bits of the codeword and a number of rows (R) equals to the parity bits added by the LDPC encoder. Each row of this matrix can then be considered as a "parity check constraint", i.e. a linear equation linking a subset of the codeword bits: when element $h_{i,j}$ is equal to one, then the $j^{th}$ bit of the transmitted codeword appears in the $i^{th}$ parity check constraint.

Figure 4B:
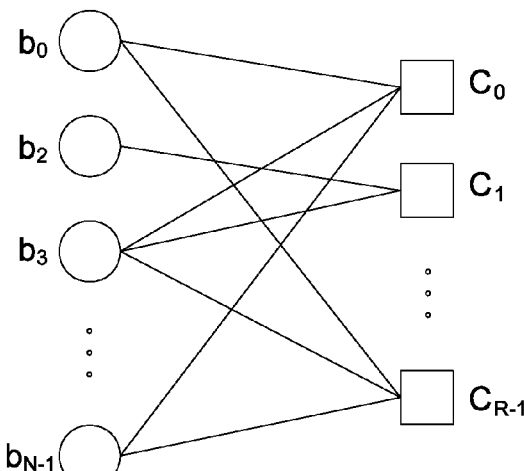

LDPC codes can be also described by means of a bi-partite graph named Tanner Graph (FIG. 4B) which is arranged in variable and check nodes. Each variable node ($b_{01}$-$b_{N-1}$) represents a bit of the transmitted codeword and corresponds to a column of the parity check matrix. Every check node ($c_0$-$c_{R-1}$) represents a particular parity check constraint and corresponds to a row of the parity check matrix. Edges connect the variable nodes to the check nodes representing parity checks constraints to which the corresponding bits participate; in other words, the XOR of all the bits corresponding to variable nodes connected to a same check node has to be equal to zero. Each node can be characterized through the so-called degree; the variable node degree ($d_v$) is the number of parity check constraints in which a particular variable is involved while the check node degree ($d_c$) is the number of variable nodes participating in a particular parity check constraint. In a regular LDPC code, labeled c(i,j), all the variable nodes have degree i and all the check nodes have degree j.

The two main techniques for decoding LDPC codes are "belief propagation" and "layered decoding"; they will be briefly outlined here. "Turbo decoding message passing" (TDMP) is a particular form of layered decoding, which is used in a preferred embodiment of the invention as it allows optimal hardware sharing with BCJR Turbo decoders.

Whenever the noisy transmitted codeword has been received, the LDPC decoder is in charge of retrieving the correct information word by detecting and removing the possible errors introduced by the channel. To this aim, the decoder follows a particular decoding algorithm which iteratively improves the reliability of the transmitted bits. Each transmitted bit ($b_n$) can be characterized by the a-posteriori log-likelihood ratio (APP-LLR) which can be expressed as:

$$\lambda_{b_n} = \log \frac{P(b_n = 1|r)}{P(b_n = 0|r)} \tag{11}$$

with r the whole received codeword and P(.) represents the probability function. From eq. (11) it can be noted that the sign of $\lambda_{b_n}$ provides an estimate of the corresponding transmitted bit (0 when $\lambda_{b_n} \leq 0$ and 1 when $\lambda_{b_n} > 0$), while the magnitude indicates its reliability (the greater is the magnitude and the higher is the reliability of the transmitted bit).

In the "belief propagation" algorithm, the a-posteriori LLR is computed as:

$$\lambda_{b_n} = \log\frac{P(r_n|b_n=1)}{P(r_n|b_n=0)} + \log\frac{P(b_n=1|r_{i\neq n})}{P(b_n=0|r_{i\neq n})} \quad (12)$$

$r_n$ being the received bit corresponding to the transmitted bit $b_n$, and the expression $r_{i\neq n}$ addresses all the bits of the received codeword except $r_n$.

The first term in the right part of equation (12) only depends on the features of the channel, so it is called intrinsic or channel LLR, while the second term is an estimate of the APP-LLR of the bit $b_n$ which does not depend on the corresponding received bit $r_n$. This latter is also known as extrinsic LLR and is updated iteration by iteration during the decoding process.

At the decoding start-up, the APP-LLR of each transmitted bit is initialized with the channel LLR and each check node receives the channel information related to the connected check nodes (variable to check message). Each check node, then, evaluates the parity check constraint and returns one piece of information for each of the connected variable nodes for a total of $d_c$ messages (check to variable message). Each variable node, in turn, receives exactly $d_v$ messages and is then able to compute the extrinsic LLR for the next iteration. The algorithm stops when the estimated transmitted codeword satisfies equation (10)—convergence reached—or after a fixed number $N_{it}$ of iterations.

Let us define:
$\lambda_{ch,n}$ the channel reliabilities, provided as inputs;
$\lambda_{bn,cm}$ the message from variable node $b_n$ to check node $c_m$;
$\lambda_{cm,bn}$ the message from check node $c_m$ to variable node $b_n$;
$b(c_m)$ the variable nodes connected to check node $c_m$;
$b(c_m)\backslash b_n$ the variable nodes connected to check node $c_m$ except $b_n$;
$c(b_n)$ the check nodes connected to the variable node $b_n$;
$c(b_n)\backslash c_m$ the check nodes connected to variable node $b_n$ except $c_m$;
$\Phi(x) = \Phi(x)^{-1} = -\log(\tan h(x/2))$ Then, the belief propagation algorithm can be written, in pseudocode:

---
Algorithm 1: Belief propagation decoding algorithm
---
input : channel LLR $\lambda_{ch_n}$, n = 0, 1, ..., N − 1
output: transmitted bit decision $\lambda_{b_n}$, n = 0, 1, ..., N − 1
1  // Messages initialization
2  $\lambda_{b_n} = \lambda_{ch_n}$, $\lambda_{b_n,c_m} = \lambda_{b_n}$, $\forall n = 0, ..., N − 1$, $\forall m = 0, ..., M − 1$;
3  repeat
4  |    // Check node phase
5  |    for m ← 0 to P − 1 do
6  |    |    forall n ∈ b($c_m$) do
7  |    |    |    // Sign update
8  |    |    |    $-\text{sgn}(\lambda_{c_m,b_n}) = \prod_{i\in b(c_m)\backslash b_n} -\text{sgn}(\lambda_{b_i,c_m})$;
9  |    |    |    // Magnitude update
10 |    |    |    $|\lambda_{c_m,b_n}| = \Phi^{-1}\sum_{i\in b(c_m)\backslash b_n}\Phi(|\lambda_{b_i,c_m}|)$;
11 |    |    end
12 |    end
13 |    // Variable node phase
14 |    for n ← 0 to N − 1 do
15 |    |    // APP-LLR update
16 |    |    $\lambda_{b_n} = \sum_{i\in cc(b_n)} \lambda_{c_i,b_n}$;
17 |    |    forall m ∈ c($b_n$) do ---
Algorithm 1: Belief propagation decoding algorithm
---
18 |    |    |    // Variable to check messages update
19 |    |    |    $\lambda_{b_n,c_m} = \lambda_{ch_n} + \sum_{i\in cc(b_n)\backslash c_m} \lambda_{c_i,b_n}$;
20 |    |    end
21 |    end
22 |    iter++;
23 until (iter < $N_{it}$ & !convergence);

Where "&" means AND, "!" means NOT and "++" is the increment operator.

"Layered decoding" is obtained by reworking the "belief propagation" algorithm in order to reduce the number of iterations required to achieve convergence.

The layered decoding algorithm counts one single phase, i.e. either check node phase (CN-centric) or variable node one (VN-centric). In a CN-centric solution all the check nodes are sequentially updated and the variable node operations are spread over each check node while in a VN-centric solution all the variable nodes are sequentially updated and the check node operations are spread over each variable node. Here only the CN-centric solution is discussed as the VLSI implementation of the VN algorithm poses several problems.

The CN-centric algorithm still receives as input the channel reliability of the transmitted codeword and as a first step, each APP-LLR takes the value of the corresponding channel LLR. The algorithm then proceeds check node by check node (or layer by layer) and the variable to check messages are retrieved on-the-fly considering that:

$$\lambda_{b_n,c_m}{}^q = \lambda_{b_n}{}^q - \lambda_{c_m,b_n}{}^q \quad (13)$$

where "q" is the index for the decoding iteration.

The check node computation is exactly the same of the belief propagation while after one single check node operation, the corresponding APP-LLRs are immediately updated and made available to the next check node. In such a way, all the on-the-fly variable-to-check computations can be performed by always using the most updated APP-LLR values, thus considerably increasing, and even doubling, the convergence speed of the algorithm. In pseudocode:

---
Algorithm 2: CN-centric Layered Decoding
---
input : channel LLR $\lambda_{ch_n}$, n = 0, 1, ..., N − 1
output: transmitted bit decision $\lambda_{b_n}$, n = 0, 1, ..., N − 1
1  // Messages initialization
2  $\lambda_{b_n} = \lambda_{ch_n}$, $\lambda_{b_m,c_n} = \lambda_{b_n}$, $\forall n = 0, ..., N − 1$, $\forall m = 0, ..., M − 1$;
3  repeat
4  |    // Loop on all layers
5  |    for m ← 0 to P − 1 do
6  |    |    // Check-node update
7  |    |    forall n ∈ b($c_m$) do
8  |    |    |    // Sign update
9  |    |    |    $-\text{sgn}(\lambda_{c_m,b_n}^{(q+1)}) = \prod_{i\in b(c_m)\backslash b_n} -\text{sgn}(\lambda_{b_i} - \lambda_{c_m,b_i}^{(q)})$;
10 |    |    |    // Magnitude update
11 |    |    |    $|\lambda_{c_m,b_n}^{(q+1)}| = \Phi^{-1}\sum_{i\in b(c_m)\backslash b_n}\Phi(|\lambda_{b_i} - \lambda_{c_m,b_i}^{(q)}|)$;
12 |    |    |    // Soft-output update
13 |    |    |    $\lambda_{b_n}[k+1] = \lambda_{b_n}[k] - \lambda_{c_m,b_n}^{(q)} + \lambda_{c_m,b_n}^{(q+1)}$;
14 |    |    end
15 |    end
16 |    q++;
17 until (q < $N_{it}$ & !convergence);

Both algorithms are complex to implement because of the nonlinear function Φ. This problem is solved by the Turbo Decoding Message Passing (TDMP) algorithm which is based on the following remark.

Figure 4C:
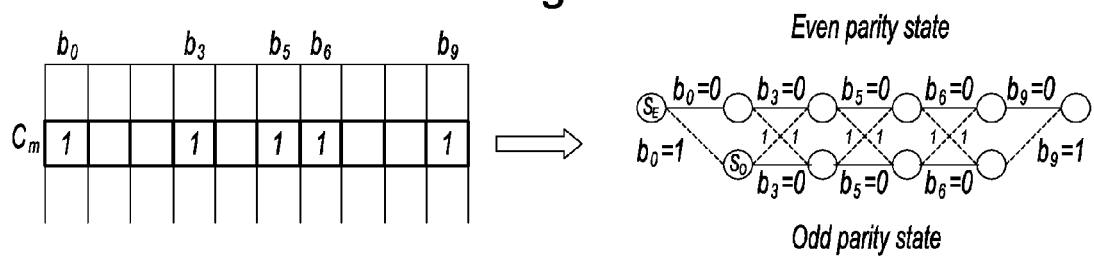

The transmitted codeword produced by the LDPC encoder has to satisfy a particular set of parity check constraints, so that the XOR operation of the transmitted bits involved in a particular check node (those marked with one), must be equal to 0 (even parity). Actually it is possible to describe this constraint by means of a 2-states trellis graph, in which the single state at the generic stage k, represents the parity after the k-th bits belonging to that constraint. Such a trellis, shown in FIG. 4C, has a length equal to the check node degree and the first and last state must be the even parity state (SE). Under these features, particular forward (α) and backward (β) metrics can be defined to calculate the updated check-to-variable messages through the BCJR algorithm:

$$\begin{cases} \alpha_{k+1}(S_E) = \max^* (\alpha_k(S_E), \alpha_k(S_O) + \lambda_{b_k,c_m}) \\ \alpha_{k+1}(S_O) = \max^* (\alpha_k(S_E) + \lambda_{b_k,c_m}, \alpha_k(S_O)) \\ \beta_k(S_E) = \max^* (\beta_{k+1}(S_E), \beta_{k+1}(S_O) + \lambda_{b_k,c_m}) \\ \beta_k(S_O) = \max^* (\beta_{k+1}(S_E) + \lambda_{b_k,c_m}, \beta_{k+1}(S_O)) \\ \lambda_{c_m,b_k} = \max^* (\alpha_k(S_E) + \beta_k(S_O), \alpha_k(S_O) + \beta_k(S_E)) - \\ \qquad \max^* (\alpha_k(S_E) + \beta_k(S_E), \alpha_k(S_O) + \beta_k(S_O)) \end{cases} \quad (14)$$

where $\lambda_{b_k,c_m}$ represents the message from the k-th variable node connected to the considered check node m and $\lambda_{c_m,b_k}$ corresponding message from the check node m back to the k-th variable node connected.

These equations can be used within algorithms 1 and 2 to compute the check node operations on line 10 and 11 instead of using the Φ function. In such a way, it is possible to implement one single BCJR engine to allow the decoding of an ordinary Turbo code and the computation of the check node phase of the LDPC algorithm, which is the most complex part of the LDPC decoding, thus achieving a great flexibility in the design of a configurable advanced error-correcting codes platform.

The use of the BCJR algorithm for decoding LDPC codes is known from the prior art. It has to be noted, however, that this does not solve alone the problem of designing a flexible hardware architecture with low complexity, low power consumption and high throughput. In particular, the present inventors have realized that parallelization is necessary in order to comply with the high data rates of modern communication standards without relying on too-high clock frequencies, which increase power consumption. They have also realized that flexibility requires the possibility of implementing different parallelization schemes with maximal hardware reusing in order to limit complexity. Efficient memory management is also of paramount importance, as channel decoders are often "memory dominated" and memory resources play a major role in complexity, power consumption and costs of the architecture implementation.

The invention will now be described with reference to a particular embodiment, implemented as an ASIC and able to comply with the requirements of the communication standards listed in Table I:

TABLE I

| Stand. | Applic. | Code | Code Length | Code Rate | Max Speed |
|---|---|---|---|---|---|
| UMTS 3GPP-HSDPA | Mobile Internet | Binary Turbo | 40-5114 | 1/3 & rate matching | 14.4 Mbps |
| IEEE 802.16e | WMAN | Duo-Binary Turbo | 64-8192 | 1/2 2/3 3/4 5/6 7/8 | 70 Mbps |
| IEEE 802.16e | WMAN | LDPC | 576-2304 | 1/2 2/3 3/4 5/6 | 70 Mbps |
| IEEE 802.11n | WLAN | LDPC | 648-1296-1944 | 1/2 2/3 3/4 5/6 | 100 Mbps |
| DVB-SH | Satellite Multimedia Contents | Binary Turbo | 1946-12282 | 1/5 2/9 2/7 2/5 2/3 | 18 Mbps |

Figure 5:
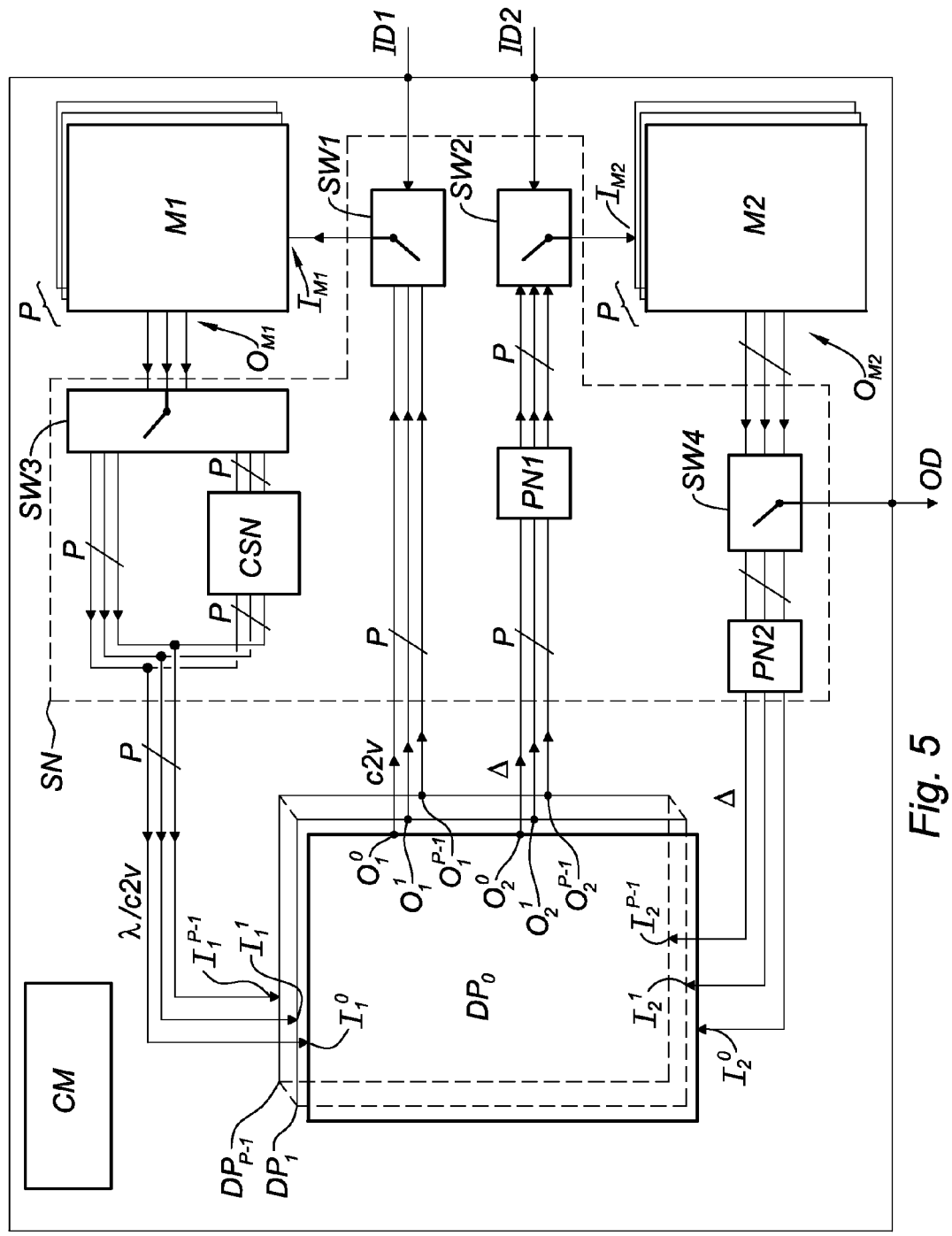
FIG. 5, the high-level block diagram of a flexible Turbo and LDPC decoder according to the invention.

FIG. 5 illustrates the general architecture of a flexible decoder according to the invention. Basically, such a decoder comprises:

A set of P Soft-Input-Soft-Output (SISO) decoding units $DP_0$-$DP_{P-1}$ having first ($I_1^i$) and second ($I_2^i$) input ports and first ($O_1^i$) and second ($O_2^i$) output ports. The number P of decoding units can be typically comprised between 4 and 16 and preferably between 8 and 12.

First and second memories M1 and M2, each comprising P independently readable and writable memory blocks having respective input and output ports. In order to save hardware resources, these memory will preferably be single-port, respective temporary buffers being provided to avoid read/write collisions. And:

A configurable switching network SN for connecting the first input and output ports of the decoding units to the output and input ports of the first memory, and the second input and output ports of the decoding units to the output and input ports of the second memory. The switching memory also manages inputs, coming from the channel (or, more precisely, from a suitable demodulator) and outputs. FIG. 5 illustrates a preferred, but not limiting, embodiment of the switching network; the person skilled in the art of digital electronic will be able to design alternative (although in general sub-optimal in terms of hardware complexity) architectures of the switching network SN.

A possible—and particularly efficient—architecture for the decoding units $DP_0$-$DP_{P-1}$ will be described later with reference to FIG. 10. Alternative architectures could be devised. Whatever the implementation details, minimal hardware complexity will be achieved by using single-core decoding units, e.g. using a BCJR, or forward-backward, algorithm for performing both Turbo- and LDPC-decoding. More particularly, the above-described TDMP algorithm will be preferably used for LDPC decoding.

For the time being, however, it will be sufficient to consider the decoding units $DP_0$-$DP_{P-1}$ as black boxes. Independently from its actual implementation, each of said SISO decoding units has:

a first input port $I_1^i$ for input reliabilities $\lambda_{i,n}$ used in Turbo-decoding, and for check-to-variable metrics $\lambda_{c_m,b_n}$ used in LDPC-decoding. For the sake of an easier notation hereafter input reliabilities and check-to-variable messages are also referred to as $\lambda$ and cv2 respectively;

a second input port $I_2^i$ for extrinsic reliabilities $\Lambda'^{APR}_{i,1\to 2}$ ($\Lambda'^{APR}_{i,2\to 1}$) hereafter simply referred to as $\Lambda$ used in Turbo-decoding and for intermediate soft outputs $\lambda_{b_n}$ (or simply SO) used for LDPC-decoding;

a first output port $O_1^i$ for check-to-variable metrics updated during LDPC-decoding; and a second output port $O_2^i$ for extrinsic reliabilities obtained as intermediate or final results of Turbo-decoding, and for soft outputs obtained as intermediate or final results of LDPC-decoding.

Note that, for the sake of an easier notation the $I_2^i$ and $O_2^i$ lines are also labeled with $\Delta$ meaning $\Lambda$ when turbo decoding is performed and SO during LDPC decoding. $\Delta$ is in turn a vector composed of K elements ($\Delta_0 \ldots \Delta_k$).

Input reliabilities, extrinsic reliabilities, check-to-variable metrics, extrinsic reliabilities and LDPC soft output have been defined above.

Input reliabilities coming from the channel are injected into memory M1 (for Turbo decoding) through a first input port ID1 of the decoder and a first switching unit SW1, or into memory M2 (for LDPC decoding) through a second input port ID2 of the decoder and a second switching unit SW2.

The general architecture of FIG. 5 allows implementing three different parallelization schemes:

the so-called "Multi-MAP" schedule—where "MAP" stands for "maximum a posteriori"—suitable for decoding Turbo codes with comparatively short codewords (or frames);

the so-called "Multi-SISO" schedule, suitable for decoding Turbo codes with longer codewords (or frames); and a layered decoding schedule for LDPC.

Figure 6A:
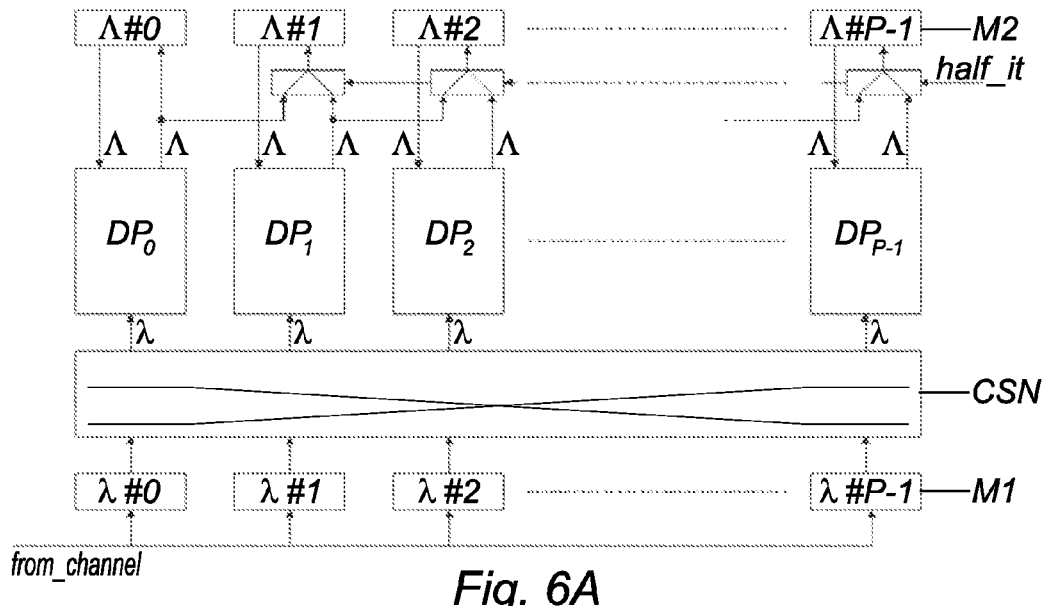

Multi-MAP decoding is illustrated on FIG. 6A. The idea is to process P frames in parallel in a pipelined manner. Actually each decoding unit performs only a limited amount of iterations and passes the estimated result to the following unit in a pipelined manner. As far as the memory resources are concerned, P different blocks must be envisaged both for the extrinsic reliabilities $\Lambda$ (M2) and for the input LLR $\lambda$ (M1) as data for P different frames must be concurrently processed (M2: blocks are designated as $\Lambda\#1$-$\Lambda\#P-1$; M1: blocks are designated as $\lambda\#1$-$\lambda\#P-1$). The reading/writing management of the second or "extrinsic" memory M2 is rather simple as data are written and read from the same block but at the end of the last iteration when they are written to the following memory block (or given as output of the architecture in the case of the last decoding unit), through a straightforward system of multiplexer. Each decoding units performs both the "SISO1" and "SISO2" processing; the binary signal "Half_it" driving the multiplexer takes the value "0" during the first (SISO1) "half iteration" and "1" during the second one (SISO2), or vice-versa. In practice, however, as it will be explained later, this system of multiplexer will be implemented using a more complex network (permutation network PN1, see FIG. 10).

The management of the input LLR $\lambda$ (M1) memory is slightly different as during the decoding process the memory must only be read. For this reason data regarding each frame are in a fixed block ($\lambda\#0$-$\lambda\#P-1$) for all the decoding time while the processing of each frame slides form block to block due to the pipeline of the operations. The "From_channel" line inputs channel reliabilities $\lambda$ which are stored in the M1 memory before being processed.

A proper reading can be performed by using the Circular Shifting Network CSN, which allows data to be retrieved from the proper memory block. An effective implementation of such a network is described in [11]. Advantages of this parallelization scheme are the management of the memory resources, which is rather simple, and the possibility of using highly optimized interleaved address generators (not requiring Look-Up Tables) within the decoding units, depending on the code under processing. On the other hand, the main drawback relies on the memory complexity which could be very high as in this solution the throughput is increased by processing several frames in parallel. This implies that each block must provide a number of locations equal to the information word length which, depending on the standard implemented, could be very high, thus making this solution impracticable (for example DVB-SH has an information word length of 12282 bits).

Figure 6B:
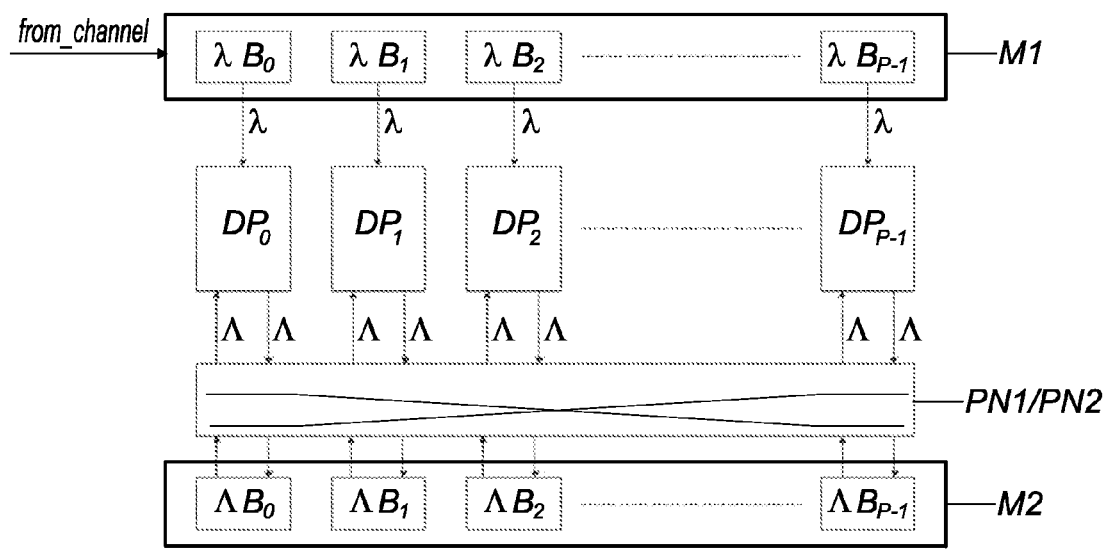
Figure 7B:
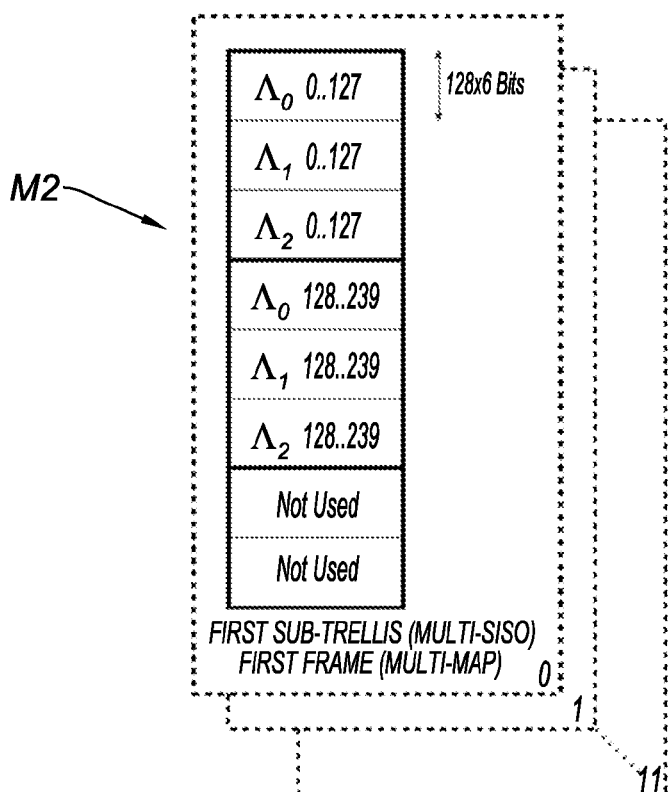
Figure 7C:
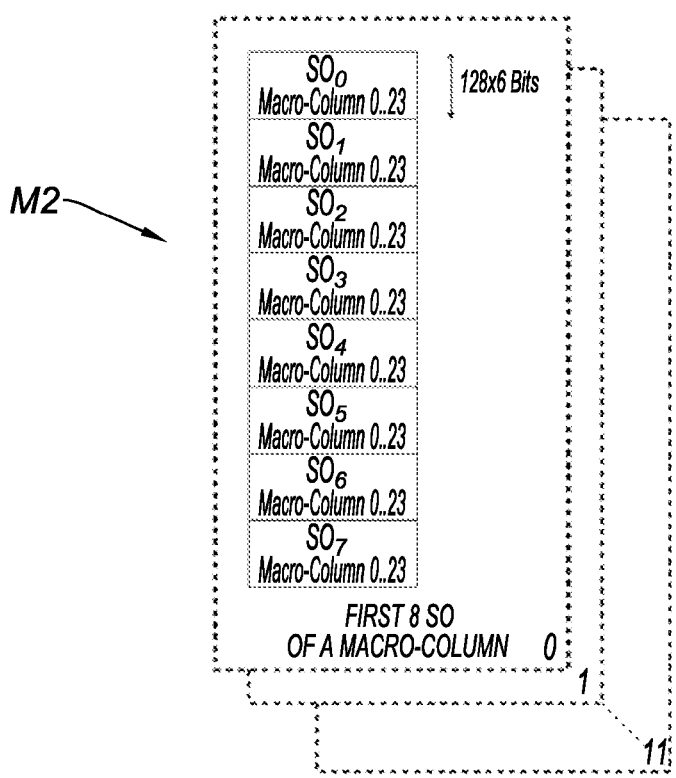

Multi-SISO constitutes an alternative solution to speed-up the decoding processing, better suited for long-frame codes than Multi-MAP. This parallelization scheme is illustrated on FIG. 6B. It allows reducing the decoding time of the single decoding units by parallelizing the operations of a single frame. In other words, only one frame at a time is decoded, but the associated trellis is divided into P different windows processed in parallel by P SISO ($DP_i$) decoding units, each acting on a limited portion of the trellis.

In this solution, since P processing, requiring different data, are performed in parallel, the memory resources must be still divided into P blocks ($\lambda B_0 \ldots \lambda B_{P-1}$ for M1, $\Lambda B_0 \ldots \Lambda B_{P-1}$ for M2), but each block comprises only K/P locations, with K the information word length, thus allowing a considerable saving in memory with respect to the multi-MAP solution.

A very critical issue of Multi-SISO parallelization is to find the proper memory allocation of the extrinsic data yielding no memory conflicts. Actually, during the second half of each iteration, extrinsic data must be processed in the interleaved order, then a proper memory allocation must guarantee that, in each of the two half iterations, all the groups of P data that are concurrently processed, will be always retrieved from different memory blocks. This problem was carefully studied by Tarable et al. [12], who developed a general algorithm capable of solving memory conflicts no matter of the code under processing and the interleaver used. The hardware overhead of this solution consists of two P×P permutation networks (PN1 on writing path and PN2 on the reading path) in order to properly select data from the different blocks.

It will be noted that the writing permutation network (PN1) is also used in Multi-MAP parallelization. This hardware sharing is clearly advantageous from the point of view of complexity.

LDPC parallelization is made possible by the fact that actual codes are based on parity check matrices having a block structure ("architecture-aware" codes). FIG. 6C shows the high level architecture of an LDPC decoding implementing the Turbo Decoding Message Passing for architecture-aware LDPC codes. Each decoding unit runs the BCJR algorithm on one or more parity-check constraints and computes both the updated Soft-Output (SO) and check-to-variable (c2v) messages to be stored into the related memories. After being read by the memory (or before being stored in memory), the new Soft-Output values must be rotated in order to be properly acquired during the following processing step. Aiming at the development of a low-complexity flexible architecture, it can be noticed that all the building blocks required by the LDPC decoding are already used into the Turbo decoding Processing thus allowing a considerable level of hardware reusing. Particularly the first memory M1 can be used to store the check-to-variable metrics, the second memory M2 stores the Soft-Output values and the rotation can be easily performed by using either the first (PN1) or the second (PN2) permutation network. (PN2 is used in the depicted embodiment).

It can then be understood that switching from one parallelization scheme to another can easily be obtained by acting on the configurations of CSN, SW3 (which switches CSN in or out the data path), PN1, PN2 and—of course—of the decoding units. This is done by a control unit CM, which can be an element of the decoder itself or an external unit.

It is worth mentioning that, depending on the specific code to be processed and on the required throughput, it may be possible to use a number P'<P of decoding units, and also P' of the P blocks of the first and second memories. In this case, the control unit CM will advantageously switch the unused decoding units and memory blocks off in order to save power.

Having described the general architecture of a flexible decoder according to the invention, it is now possible to describe its constitutive units, namely the first and second permutation networks, the circular switching network, the first and second memory and the individual decoding units, referring to exemplary and non-limitative embodiments. Hardware—and particularly integrated—implementation of these constituent units is preferred; however, some or all of them can also be partly or wholly implemented as software run on a suitable programmable circuit. Switching units SW1-SW4 are trivial, and the person of average skill will be able to realize the control unit CM as a programmable or hard-wired circuit, e.g. in the form of a finite state machine whose state transitions and operations depend on the code under processing. The exemplary embodiments discussed here refer to a decoder comprising P=12 decoding units and able to process binary and duo-binary Turbo codes as well as LDPC codes, with different codeword lengths K and characterized by trellises having up to $v_{maw}=8$ states.

Before that, however, it is expedient to briefly discuss the data representation, which is one of the most critical issues in implementing an algorithm into a real architecture. Indeed, the precision of the operations must be carefully set as a trade-off between complexity and implementation loss. Aiming at a low-complexity implementation of the flexible channel decoding platform, the decoding algorithm must be modeled into the fixed point domain so as to process only integer values with a limited number of bits. In an exemplary embodiment, on which is based the following description of the inventive decoder, the maximum tolerable implementation loss due to the fixed point representation and to the false detection rate is set to 0.4 dB. As a result, the LLR metrics are coded on 5 bits while the state-metric and extrinsic metrics are represented on 7 bits. Furthermore, one bit truncation is introduced before the storage into the M1 and M2 memories so as to reduce the overall memory complexity.

The first (or "writing") and second (or "reading") permutation networks PN1, PN2 are required, according to Tarable et al. [12] to avoid data conflicts between the SISO1 and SISO2 processing due to the interleaver law when a Multi-SISO approach is pursued. These permutation networks could be implemented as fully-configurable crossbar switches, but optimized implementation can reduce their hardware complexity.

Figure 26:
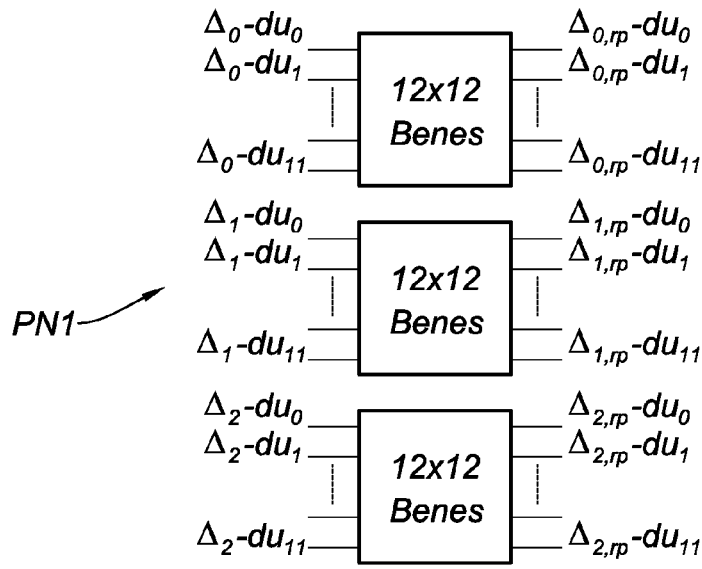
Figure 27:
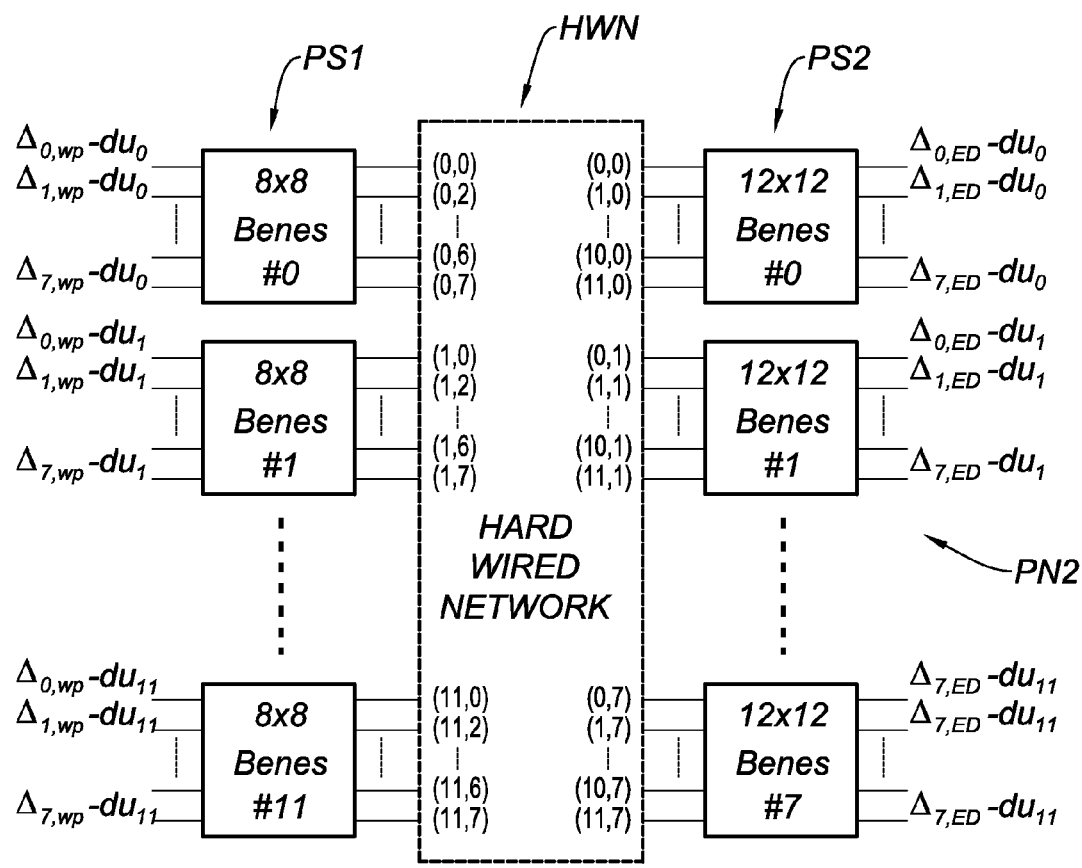

FIG. 26 illustrates an optimized architecture for the first permutation network PN1. It can be proven that at most three of the 8 metrics $\Delta_0$-$\Delta_7$ outputted by each of the P (in this exemplary embodiment, P=12) decoding units have to be permuted (in the duo-binary Turbo-code case) while the remaining ones are written with no permutation in memory (LDPC case). For this reason the overall architecture is composed of three P×P (here, 12×12) Benes networks which are configured to be transparent when a Multi-MAP or LDPC decoding is on-going. On FIG. 26, and on FIG. 27 as well, $\Delta i$-$du_j$ indicates the $i^{th}$ output of the $j^{th}$ decoding unit.

The second ("reading") permutation network PN2 is more complex, because it also serves, in LDPC, to perform a circular rotation over a number of elements equal to the codeword-size. The architecture of such a network is illustrated on FIG. 27 where two stages of permutation can be identified. Particularly the first stage PS1 locally permutes the elements of each decoding unit and the resulting output vector is properly routed by a hard-wired network HWN to the second stage PS2. Note that, in the case of Turbo decoding, the first stage is actually not needed and is configured so as to be transparent.

Figure 31:
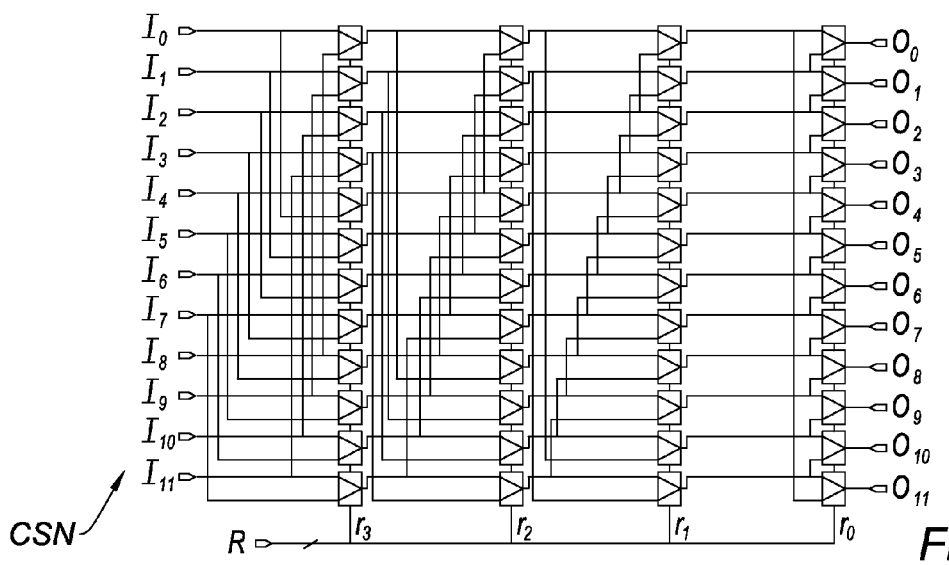

Standard Benes and Banyans networks are not suitable to implement the P×P circular switching network CSN because P is not, in general, a power of two. As already mentioned, in [11] some of the present inventors have disclosed an efficient multiplexer-based architecture which can advantageously been used in the implementation of the inventive decoder. FIG. 31 illustrates a 12×12 CSN of this kind, constituted by 48 2×1 multiplexers arranged in four stages. The network of FIG. 31 is based on the principle of the "barrel shifter"; in the most general case, the number of stages is n=⌈$\log_2 P$⌉ and the number of multiplexer per stage is equal to P. On FIG. 31, $I_0$-$I_{11}$ are the labels of the input ports and $O_0$-$O_{11}$ those of the output ports of the CSN.

Multiplexers on the i-th stage of the shifter, with 0≤i<n, are connected in such a way to circularly shift (rotate) the input vector by $2^i$ if the control bit belonging to the control vector $R=[r_0, r_1, r_2, r_3]$, is set; otherwise, the stage is transparent to the input. In this way, the arbitrary rotation $\rho=0,1, \ldots N-1$ is decomposed into n consecutive rotations by powers-of-2.

The advantage of a barrel shifter with respect to a Banyan network is that not only it requires less multiplexers by removing the power-of-2 constraint on N, but also it does not need to store or pre-compute any configuration bit, since its stages are directly driven by the bits $r_i$ of the binary representation of $\rho$, i.e., $\rho=\langle r_{n-1}, \ldots, r_1, r_0 \rangle$.

Memory organization constitutes the bottleneck in terms of complexity and power consumption. While the global number of locations should be limited by the maximum supported codeword length, the proper number of blocks must be selected in order to support all the codeword lengths and the parallelism degrees defined by the reference scenario. Particularly, the maximum codeword length is defined by the DVB-SH standard with a value of K=12282.

The single-port memory M2 stores the a-posteriori extrinsic reliabilities produced by each SISO and the Soft Output reliabilities of the LDPC decoding. Although the architecture would support the decoding of two concurrent frames of a turbo binary code, as a design choice to decrease the memory complexity, only one single binary frame at a time is processed by each decoding unit. Accordingly, each memory location should comprise one single $\Delta$ value in the case of binary Turbo Codes, three different values in the duo-binary case ($\Delta(0)$, $\Delta(1)$, $\Delta(2)$) and eight Soft Output values when an LDPC code is processed. As discussed above, in order not to replicate memory resources, the Multi-SISO mode must be used for long codeword lengths thus forcing the minimum number of banks to be equal to the parallelism degree (in the exemplary embodiment considered here, P=12) so as to guarantee no memory conflicts. Memory M2 is then split into 12 blocks ($M_i$) whose dimension (Li) is given by:

$$L_i = \lceil K_{max}/P \rceil = \lceil 12282/12 \rceil = 1024$$

This arrangement is also able to support the maximum codeword length of a binary code using the Multi-MAP mode, e.g. the 3GPP having K=2045. Actually in this case, only 6 data-paths are required so the extrinsic reliabilities can be stored into two memory blocks with an overall capacity of 2048 messages.

The storage capacity of a single block should be able to support the Multi-MAP duo-binary mode for the IEEE 802.16e (WiMAX) standard, where the maximum frame length is equal to 240 symbols (for longer words, Multi-SISO will be used instead of multi-MAP). Considering that 3 metrics per symbol have to be stored, the single block storage capacity should be equal to 240×3=720. The maximum codeword length for the LDPC considered here is $K_{max}$=2304 (IEEE 802.16e standard). The number of data (i.e. metrics) which has to be stored by each block is $K_{max}$/P=2304/12=192. Finally, since each decoding unit manages 8 SO data in parallel, the aspect ratio of the memory bank is 24*8.

FIGS. 7A1, 7A2, 7B and 7C show the final extrinsic (M2) memory arrangement with the related filling strategy for the Turbo binary—Multi-MAP, Turbo binary—Multi-SISO, Turbo duo-binary and LDPC case respectively. On FIG. 7C, "macro-column" refers to the block structure of the parity check matrix H for "architecture aware" codes. Indeed each macro-column is composed of a certain set of variable nodes which defines the maximum degree of parallelism in LDPC codes.

Memory M2 also comprises a temporary buffer TB-M2 which must be able to store a number of reliabilities per decoding unit equal to the maximum window length ($W_{max}$=74) within the Turbo case and to the maximum check-node degree ($d_{c,max}$=22) in LDPC processing. The concept of "window length" refers to the fact that, in order to speed-up backward and forward recursion, the coding trellis is split into shorter windows ("sliding window algorithm", known from prior art and which will be discussed with some detail when describing the architecture of the decoding units). As a result, the buffer is composed of P=12 blocks (one per decoding unit), in turn arranged into 9 memory banks of 22 elements each.

Indeed, for binary turbo codes, a maximum of 74 data ($W_{max}$) can be stored in the first three banks. For duo-binary turbo codes, a maximum of 74×3 data (i.e. metrics) must be stored for a total of 222 metrics. Then the first 25×3 data are stored in the first three banks and so on to cover the 9 available banks. For LDPC codes, the maximum number of data to be stored per check node is equal to the maximum check node degree; since each decoding unit manages 8 check nodes, it follows that the memory has to store 8×22 messages.

Figure 8A:
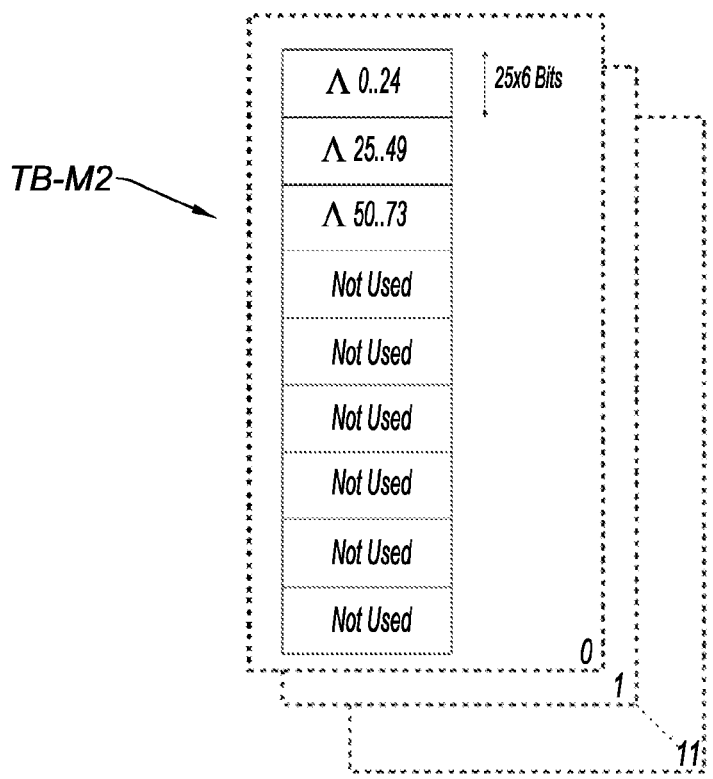
Figure 8B:
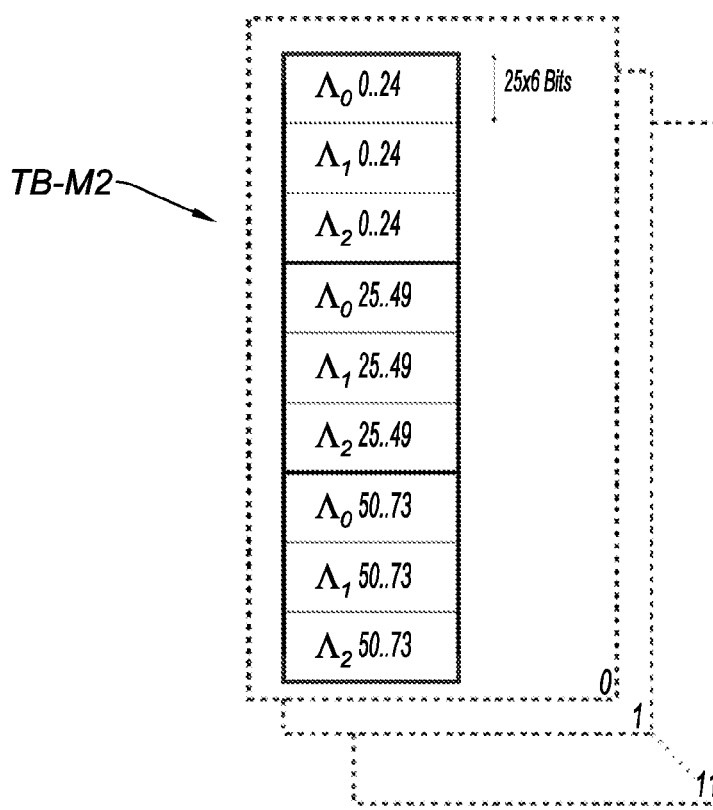

Such a configuration allows the support of all the reference scenario configurations with the minimum waste of memory. FIGS. 8A, 8B and 8C detail the filling strategy of the buffer for the binary, duo-binary and LDPC case respectively.

As a conclusion, the total number of bits required for the M2 "extrinsic" memory and temporary buffer are:

$$\begin{cases} Bit_{M2} = 12 \times 8 \times 128 \times 6 = 73728 \\ Bit_{TB-M2} = 12 \times 9 \times 25 \times 6 = 16200 \\ Bit_{M2-tot} = Bit_{M2} + Bit_{TB-M2} = 89929 \end{cases}$$

It should be stressed that the optimal memory organization depends on the reference scenario, i.e. on the codes considered when designing the decoders. A different reference scenario would have led to a different memory management strategy.

Figure 24:
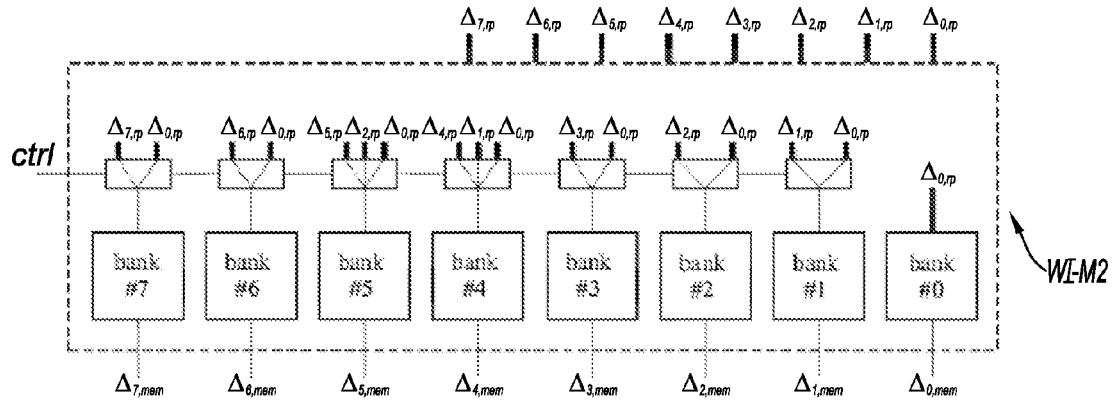

Although not indicated on the general architectural scheme of FIG. 5, data coming out form the first P×P permutation network PN1 must be properly arranged by a suitable writing interface before being stored into the memory M2 with the filling strategy of FIGS. 7A1-7C. FIG. 24 shows the architecture of the writing interface W1-M2 for one single block of the memory M2; it is a simple circuit, only constituted by 2-to-1 and 3-to1 multiplexers where $\Delta 0_{,rp} \ldots \Delta 7_{,rp}$ are the 8 Λ/SO data coming out from each single Decoding Unit (after permutation through PN1) while $\Delta_{0,mem} \ldots \Delta_{7,mem}$ are the corresponding data read from memory.

$O_2^i$ is a vector of 8 elements ($\Delta_0 \ldots \Delta_7$). In the binary Turbo-code case, only $\Delta_0$ is valid since only one metric is provided per processing unit; consequently this value can be stored in any of the memory locations. In the duo-Binary Turbo-code case the valid data are $\Delta_0$, $\Delta_1$ and $\Delta_2$, as three metrics must be provided per each symbol. This means that $\Delta_0$ can be stored either in the first or fourth bank, $\Delta_1$ either in the second or fifth bank and $\Delta_2$ either in the third or sixth bank. Finally in the LDPC case all the 8 values are valid and can be stored in the corresponding banks (with same index).

Figure 25:
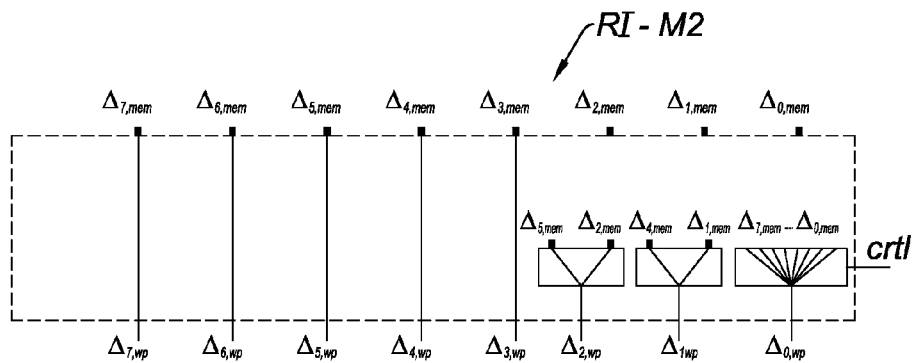

After being stored into the M2 memory, data must be then read and re-arranged so as to attain the same configuration output by the decoding units. FIG. 25 shows the architecture of the reading interface for one single block of the memory. Again, this is a simple circuit consisting of multiplexers and direct connections where $\Delta_{0,mem} \ldots \Delta_{7,mem}$ are the 8 Λ/SO data coming out from memory while $\Delta_{0,wp} \ldots \Delta_{7,wp}$ are the corresponding data feeding PN2.

Focusing on the binary turbo decoding, data are spread in memory across all the 8 banks and must be then routed to the first line of the output vector. To this extent a 8-to-1 multiplexer properly driven by the control logic is required.

On the other hand, the second and third output could represent a valid data both in the duo-binary and LDPC case. Consequently these lines could be connected to the corresponding input (second and third) in the LDPC case or when a duo-binary data is retrieved from the first three banks, while input 4 and 5 are promoted as output on lines 2 and 3 when a duo-binary data is read from banks #3, #4 and #5. Basically this procedure is the dual of the filling strategy for the memory: data must be brought back in the same way they were output by the processing unit.

Finally the last 5 outputs are directly connected to the corresponding input and can be considered valid only into the LDPC case.

The single-port λ/c2v (or M1) memory stores the input reliabilities coming from the channel for the Turbo codes and the check-to-variable messages for the LDPC decoding. Again, the total number of locations must be set according to the worst-case configuration, that is still the DVB-SH with K=12282. In such a case each stage of the trellis requires 5 values, which are the LLR of the systematic bit and two LLRs regarding the parity bits of each convolutional encoder. Consequently the total number of messages to be stored is equal to 12285×5=61425. Note that 3 extra trellis stages have been added so as to take into account the termination values. In the duo-binary case, 6 messages must be stored per trellis stage (2 systematic bit LLRs and 4 parity bit LLRs) and, considering the maximum symbol (i.e. trellis) length equal to N=2400 the total amount of storage required is equal to 2400×6=14400.

As far as the LDPC codes are concerned, the maximum number of messages to be stored is equal to the maximum value of the product codeword-size×Non-null blocks of the prototype matrix which is equal to 96×88=8448 in the IEEE 802.16e standard. Note that in this case 96 messages must be concurrently read/stored in memory in order to guarantee the proper architectural parallelism.

In view of the above-mentioned aspects the M1 memory is arranged into 12 blocks each one comprising 2 banks of 512 locations. Each location is in turn capable of storing $5\lambda/c2v$ messages.

Focusing on a single block it is then possible to process, 5, 6 or 8 data in parallel for the binary, duo-binary and LDPC case respectively.

FIGS. 9A1, 9A2, 9B and 9C show the filling strategy of the memory for the binary Multi-MAP, binary Multi-SISO, duo-binary and LDPC case respectively. Note that again here the filling schedule for the binary case is different depending on the decoding mode selected.

As a final result, considering that each message is represented on 5 bits, the total number of bits required for this memory is:

$$Bit_{chan} = 12 \times 2 \times 512 \times 5 \times 5 = 307200$$

It will be understood that all the numerical values provided here are only exemplary and non-limitative.

The decoding units DP are the other main elements of the inventive decoder. In a preferred embodiment, illustrated on FIG. 10, they are designed to perform Turbo decoding based on the BCJR sliding windows algorithm, and LDPC decoding based on the TDMP algorithm (which, in turn, relies on the BCJR algorithm).

Figure 10:
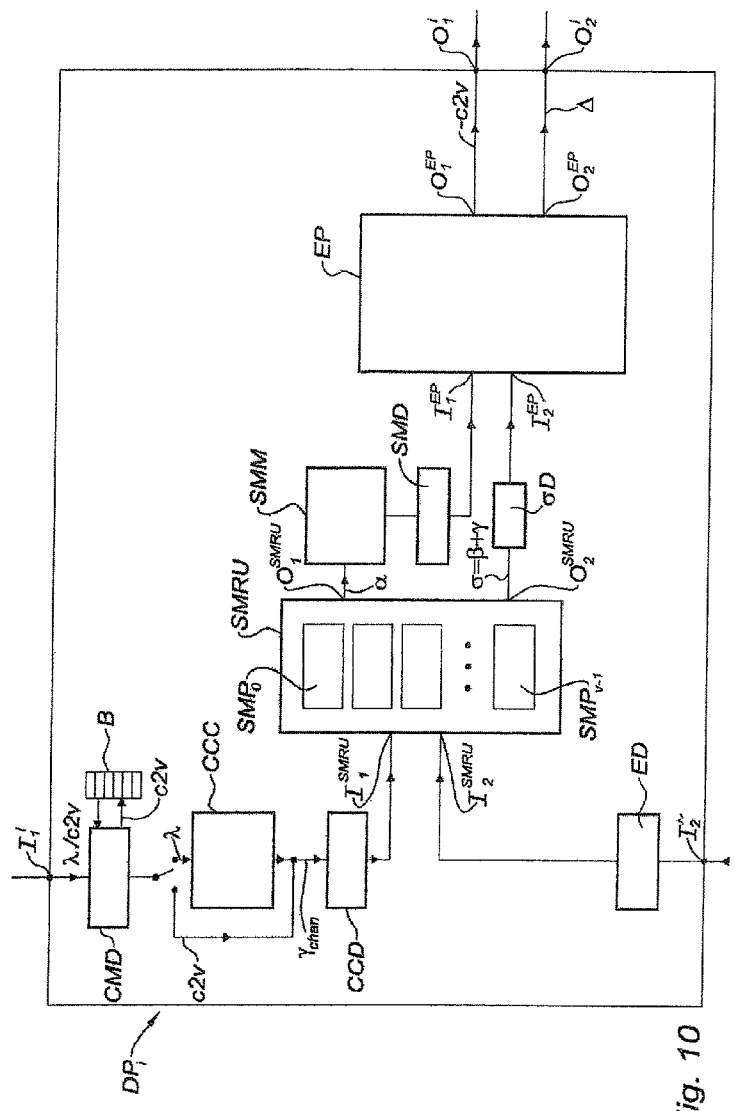

The decoding unit DP; of FIG. 10 comprises four main functional blocks (CCC, SMRU, SMM, EP) connected with each other and with the first and second input ports through configurable "distribution" or "adaptation" networks (CMD, CCD, ED, SMD, σD). These adaptation networks are important for implementing flexibility: their role is to modify the data format depending on the particular code processed by the decoding unit. The detailed description of the individual functional blocks and adaptation networks will be preceded by a general overview of the operation of the decoding unit.

Figure 11:
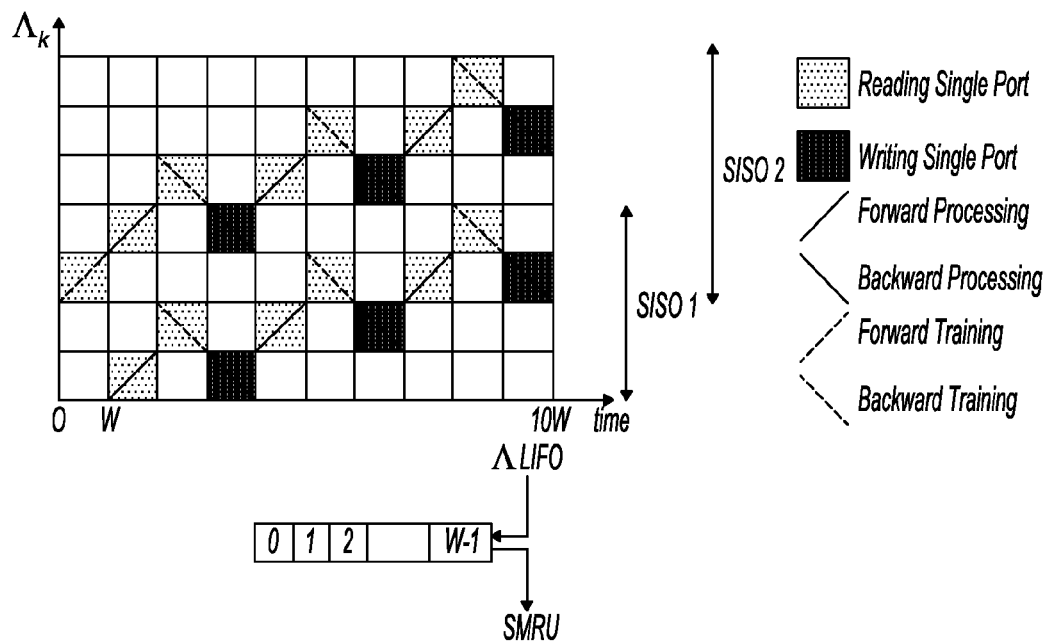

FIG. 11 shows the data schedule of the BCJR sliding windows algorithm used for Turbo decoding. More precisely, FIG. 11 shows the schedule of the Multi-SISO approach in which different sub-trellises are processed in parallel. This is the most general case, as the data schedule of the multi-MAP approach is obtained by removing the upper sub-trellis processing. The SISO2 will perform the same processing of SISO1 but considering a different frame.

The entire trellis is arranged into different windows with length W which are processed consecutively. The initialization values for the different backward recursions are retrieved through the use of W-long training sequences as described in [13]. Aiming at a low complexity solution, only one single processor (State-Metric Recursive Unit, SMRU) is designated to perform the whole recursion process, then a single window computation is divided into three stages:

Forward recursion: the SMRU takes as input the extrinsic reliabilities for the considered window which are read from the M2 memory (through PN2 and ED) and the cumulative messages which can be derived from the channel LLR ($\lambda$) through the channel cumulative computation (CCC) and distribution (CCD) networks, whose architecture and operation will be discussed later. In order to implement single port memories, data read from the M2 memory are stored into a temporary Last-In First-Out (LIFO) buffer. The forward metrics are finally computed and stored into the state-metric memory (SMM).

Backward training: the SMRU is initialized with all-zero values and a W-long backward recursion is performed. In this case data belonging to the next window must be taken as input and no intermediate metrics need to be stored.

Backward recursion and extrinsic reliabilities update: the backward recursion is finally performed and concurrently the updated extrinsic metrics are calculated by the extrinsic processor (EP), whose architecture and operation will be discussed later, and stored back into memory. In this case while the M2 memory is being written, input data for the backward recursion are retrieved from the temporary LIFO buffer. The EP is finally the block in charge of updating the extrinsic reliabilities by reading the forward metrics from the SMM and on-the-fly receiving the updated backward data.

The initial forward metrics at the beginning of the first window might be unknown (e.g. circular turbo codes or multi-SISO schedule), then in such a case an extra W-long forward training sequence must be performed.

As already mentioned, the LDPC decoding relies on the TDMP algorithm in which each check node can be represented by means of a two-state trellis with length equal to the check node degree (number of variable nodes connected to a check node) and processed using the BCJR algorithm. Given the relatively low check-node degrees defined by the modern communication standards (i.e. not greater than 22), the sliding window data-schedule is no longer needed; then the whole trellis is processed in two stages only:

Forward recursion: Check-to-variable messages are read from the related memory and turned into the proper format by the channel metric distribution (CMD), as it will be described later. In this case, since the updated data must be wrote back into the M1 memory during the backward recursion phase, the read c2v metrics are also stored into a LIFO buffer so as to keep the M1 memory as a single port RAM. The CCC block is then simply by-passed since no arithmetic operations are needed while the CCD block is used to produce the proper input configuration to the SMRU. Soft Output (SO) reliabilities are retrieved from memory M2 (again data are also stored into a LIFO buffer) and the P×P permutation network PN2 is used to perform a circular data rotation for the Architecture-Aware LDPC codes. The forward recursion can be then performed by the SMRU and the intermediate metrics stored into memory. Note that, since the most common Turbo codes define 8-states or 16-states trellises, more than one 2-statetrellis (i.e. check nodes) can be processed in parallel by the SMA.

Backward recursion and metrics update: Check-to-variable and soft output messages are retrieved in this case from the related LIFO buffers and while the backward metrics are being evaluated by the SMRU, the forward metrics are read from the SMM and the updated messages can be concurrently evaluated by the EP and stored back into the corresponding memories. Note that in this case no permutation is required.

Both in the LDPC and in the Turbo case, recursive decoding can be carried out for a fixed number or iteration, or until a suitable stopping rule is satisfied (in practice, when a stopping rule is used, a maximum allowable number of iterations is also set to avoid being stuck in case of non-convergence of the decoding). Use of stopping rules is much preferred in order to save power; however, the added complexity introduced by their implementation has to be minimized.

LDPC stopping rules are not an issue, as a simple XOR parity check of the estimated output is sufficient.

Figure 12:
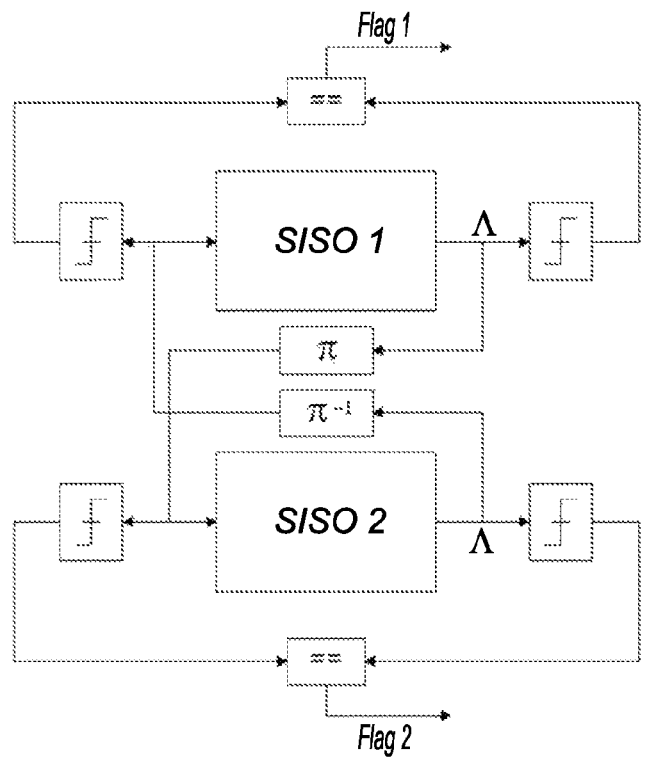

Several stopping rules for Turbo codes are known from the prior art. A preferred embodiment of the invention implements a modified version of the "Hard Decision Aided" (HDA) rule [2], whose reference scheme is illustrated by FIG. 12, where HD indicates hard decision; "=" an equality check (output equal to 1 if and only if the two inputs are equal to each other) and ED an error detector. Convergence can be declared either when one (single-consistency) or both (double-consistency) the flags signal the data consistency. A detailed analysis shows that duo-binary codes require both the flags to be asserted in order to avoid floor issues, while one single flag asserted is enough to guarantee good performance for binary codes. In actual implementations, each decoding unit $DP_i$ plays the role of both SISO1 and SISO2. Therefore, the complexity overhead is only due to two hard decision blocks and one simple finite state machine to perform the consistency check (error detector).

It is now possible to describe in detail the operation and structure of the different functional blocks and adaptation networks forming the decoding units $DP_i$, according to a preferred embodiment of the invention.

Figure 13:
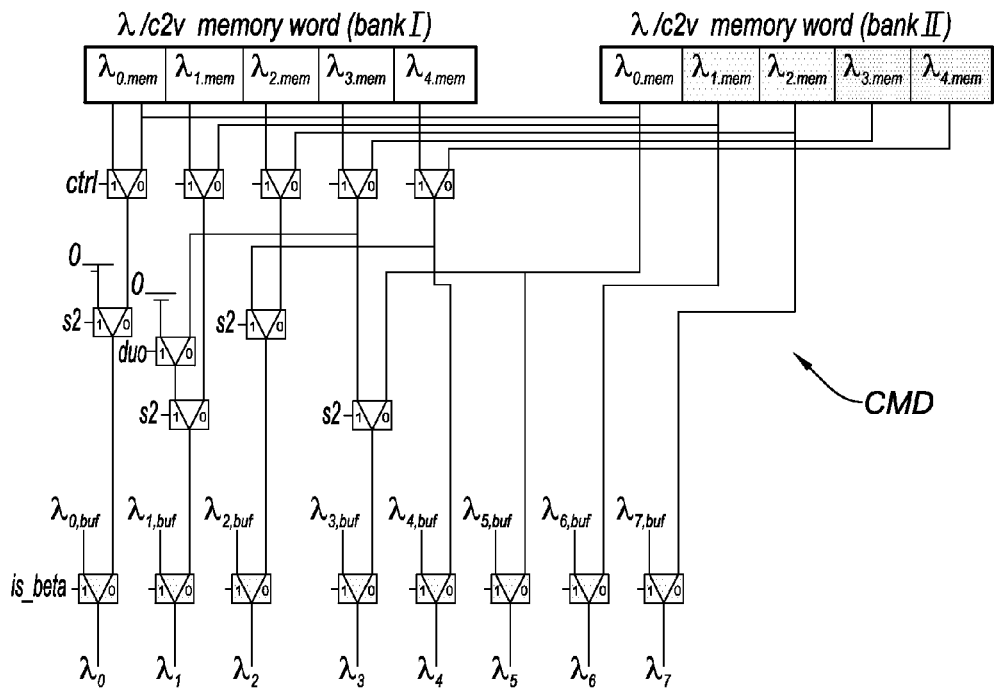

As apparent from FIG. 10, the LLR values λ (for Turbo decoding) and the check-to-variable messages c2v (for LDPC decoding) stored in the first memory M1 enter the decoding unit from the first input port $I_1^1$ and are formatted by the "channel metric distribution" network CMD, a possible implementation of which is illustrated on FIG. 13 where the data stored in memory are simply denoted with $\lambda_{i,mem}$, data in the temporary buffer with $\lambda_{i,buf}$ and output data with $\lambda_i$.

As already mentioned, in the exemplary embodiment a single memory block is composed of two banks whose locations comprise five messages. Consequently when a binary Turbo code is processed, the five required data can be read either from the first bank or the second one following the filling strategy depicted in FIG. 9A1/9A2. This schedule is guaranteed by a first stage of multiplexers which are driven by the control logic.

Moreover the required output are three (1 systematic plus 2 parities) and this must be selected depending on the decoding phase; this selection is performed by multiplexers driven by the binary control signal s2. Actually when the SISO1 decoding is in place the first three output of the first multiplexing stage are directly routed to the output while in case of SISO2 the first output must be 0 (no systematic information for the second encoder) while the last two data of the multiplexing stage must be promoted as valid output on line 1 and 2 respectively.

For duo-binary Turbo codes ("duo" signal is set to one), 6 data are available in memory according to FIG. 9B, then the "ctrl" (control) pin of first multiplexing stage is set to 1. Differently from the binary case four data are required as output and during the SISO1 phase the first four data in memory are routed to the output while during the SISO2 processing the first two output are set to 0 (no systematic information for the second encoder) while memory data 4 of the first bank and 0 of the second one are promoted to the third and fourth output lines.

Finally, within the LDPC decoding the 8 required data are routed directly from the memory to the output during the forward recursion and the backward training phases. On the other hand, during the backward computation, since the single port memory is being written, data are retrieved from a temporary buffer B.

The channel cumulative messages $$\gamma = \sum_n c_n^e \cdot \lambda_{i,n}$$

(see equation 5) are derived from the input LLRs and the particular edge to be addressed. Given a generic convolutional encoder, the number of input LLRs per trellis stage is equal to the number of the encoder output ($N_O$) and consequently the overall number of channel cumulative messages is equal to $N_C=2^{N_O}$. As a strategy to reduce the memory complexity, only the input LLRs are stored in memory M1, while channel cumulative messages are computed on-the-fly through an ad-hoc adder network CCC.

In the technical literature, "channel cumulative messages" are also referred to as "branch metrics". However, the expression "branch metrics" is somehow ambiguous, as it is sometimes used for designating α and β as well as γ.

Figure 14:
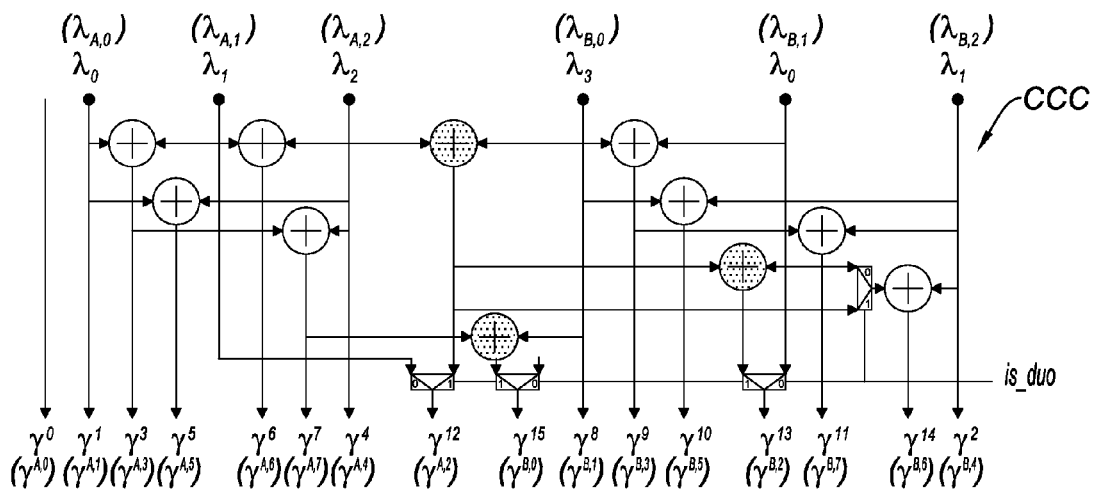

An example of such a network is shown on FIG. 14; this is able to cope with $N_O=3$ for the binary codes and $N_O=4$ for the duo-binary ones, which is sufficient to deal with all the codes of the modern communication standards. If higher $N_O$ values were necessary, however, extension of the architecture would be straightforward. The network of FIG. 14 can evaluate channel cumulative messages for two concurrent binary frames, A and B (even if, as discussed above, this feature has not been used in the exemplary embodiment in order to minimize the memory complexity); signals in brackets refer to said two concurrent binary frames, and signals without brackets refer to a single duo-binary frame. When binary frames are processed, the "is_duo" signal is set to 0; for duo-binary frames, this signal is set to one. The "is_duo" signal drives four 2×1 multiplexer, thus ensuring the configurability of the CCC unit.

As an arbitrary choice, on FIG. 14 the output signals are marked with the decimal representation of the edge label where the information symbols are always considered in the least significant position. For example, the output 11 in the duo-binary case, corresponds to "1011", thus meaning that the first and second parity bits are "1" and "0" respectively while the information symbol is "11"(3).

The architecture of the CCC network has been optimized to minimize the number of adders which turns to be eleven, for a network supporting two concurrent binary frames. This level of optimization has been achieved by replicating two of the four input LLRs when a duo-binary code is processed ($\lambda_0$, $\lambda_1$). The adders in dark grey on the figure serve to implement the flexibility between binary and duo-binary codes.

Finally it is important to note that when a code with a certain No value is decoded, only the channel cumulative messages marked with a number less than NC−1 can be regarded as valid output.

As already mentioned, for LDPC decoding, the CCC network can be simply by-passed as the check-to-variable messages c2v from the memory M1 directly feed the State Metric Recursive Unit SMRU and do not need to be cumulated.

Figure 15:
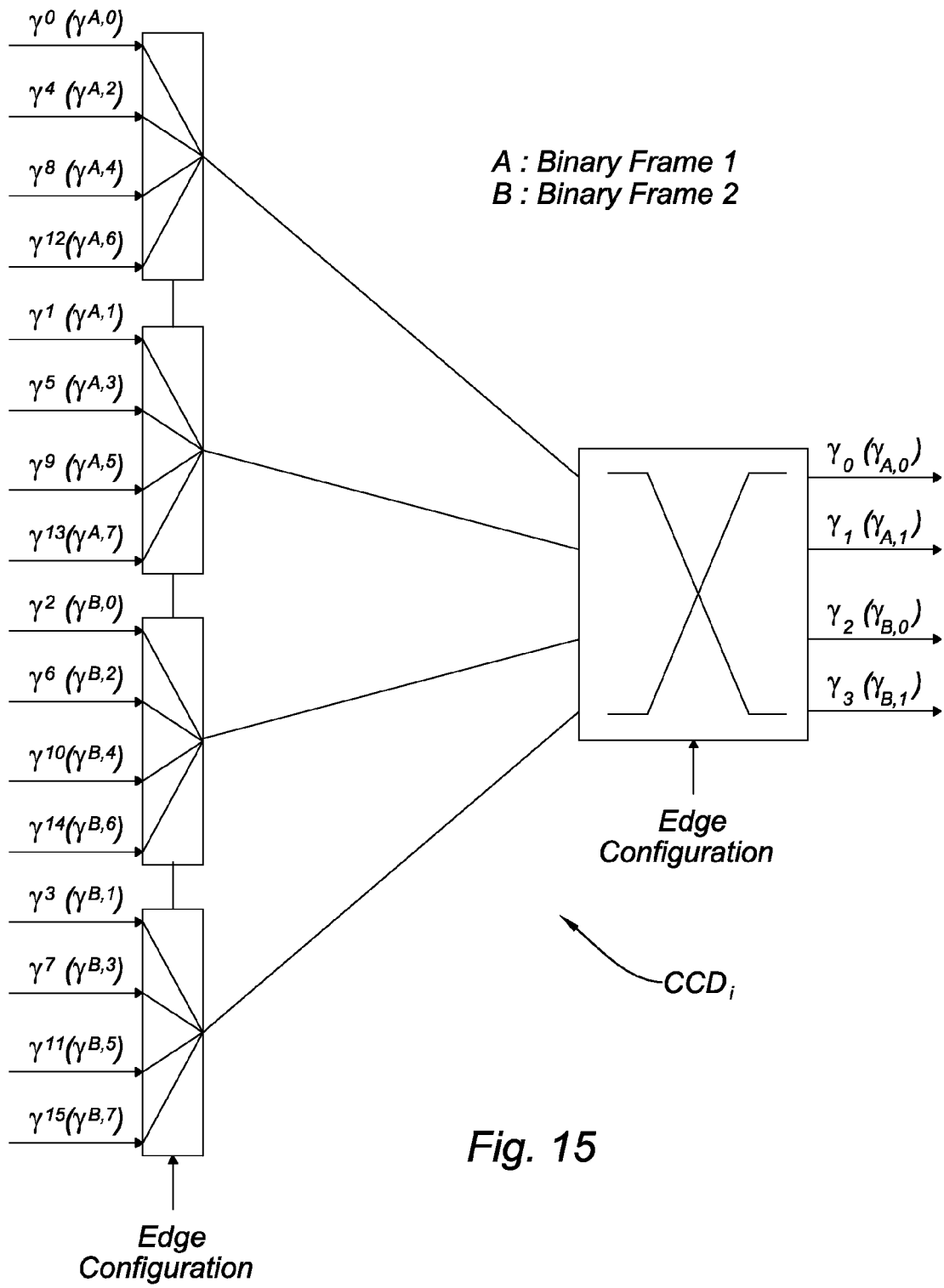

Channel cumulative messages, computed on-the-fly at each trellis stage, must be then properly distributed to the eight forward/backward processors. An optimized channel cumulative distribution network CCD is composed of eight sub-networks $CCD_i$, individually feeding the forward/backward processor SMRU. FIG. 15 illustrates the structure of an optimized sub-network, comprising four 4-to-1 multiplexers and one 4×4 permutation network. This architecture is based on a general property of trellis graphs associated to recursive codes generated by linear feedback shift registers, namely the fact that each state of a trellis stage is connected with the states of the previous stage through edges labeled with different information symbols. The "edge configuration signal" depends on the set of transmitted bits labeling the edges of the trellis. Therefore, the control of the multiplexers and permutation networks depends on the trellis under processing.

Actually, considering the duo-binary case, the final output must be composed of four metrics having different information symbols, thus allowing the use of four input 4-to-1 multiplexers each one selecting among metrics with the same information symbol (metrics spaced by four). Finally, the 4×4 permutation network again allows different data distributions depending on the code under processing.

In the binary case, the architecture is split into two independent networks as the 4×4 permutation network is configured as two crossbar switches. The upper part then distributes data for the first frame while the lower part copes with the second one. This network, too, can be used to cope with two concurrent binary frames.

It is important to note that the overall network implements the flexibility, since a simple hard-wired network would be required in case of an optimized solution capable of decoding only one code family.

Figure 19A:
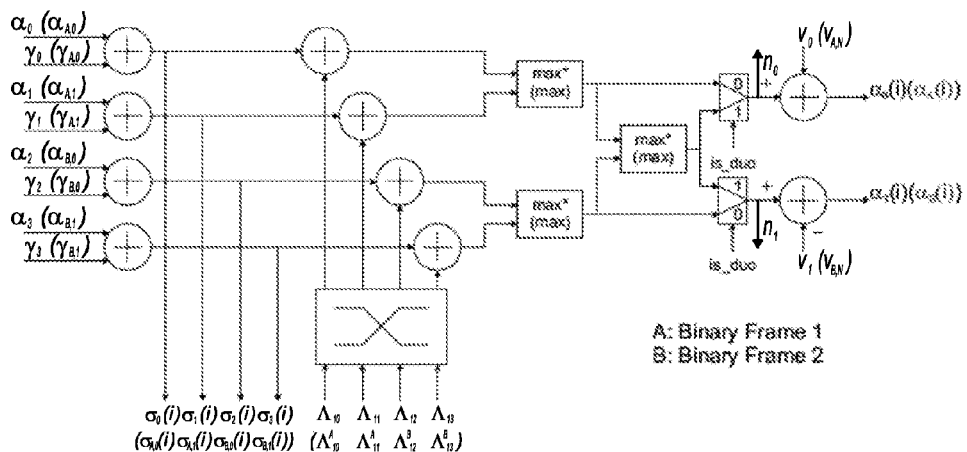
Figure 19B:
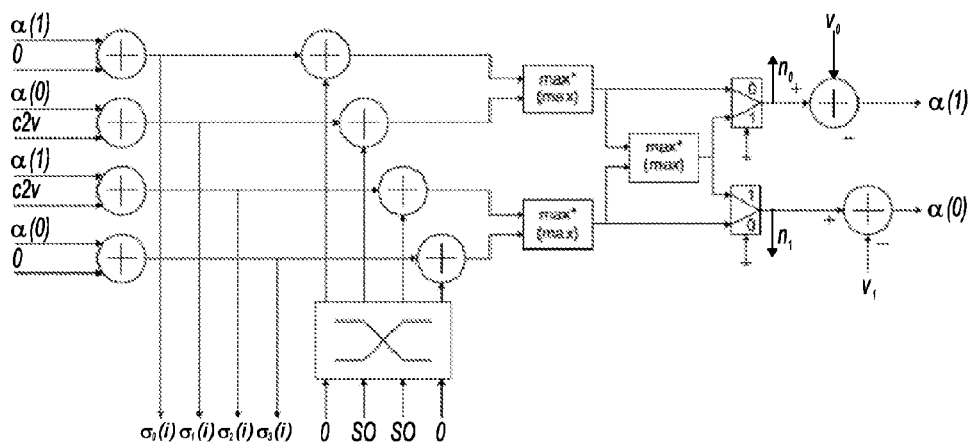

Within the LDPC decoding, this network can be configured to produce the proper input configuration of the forward/backward processor as shown in FIG. 19B.

Figure 16:
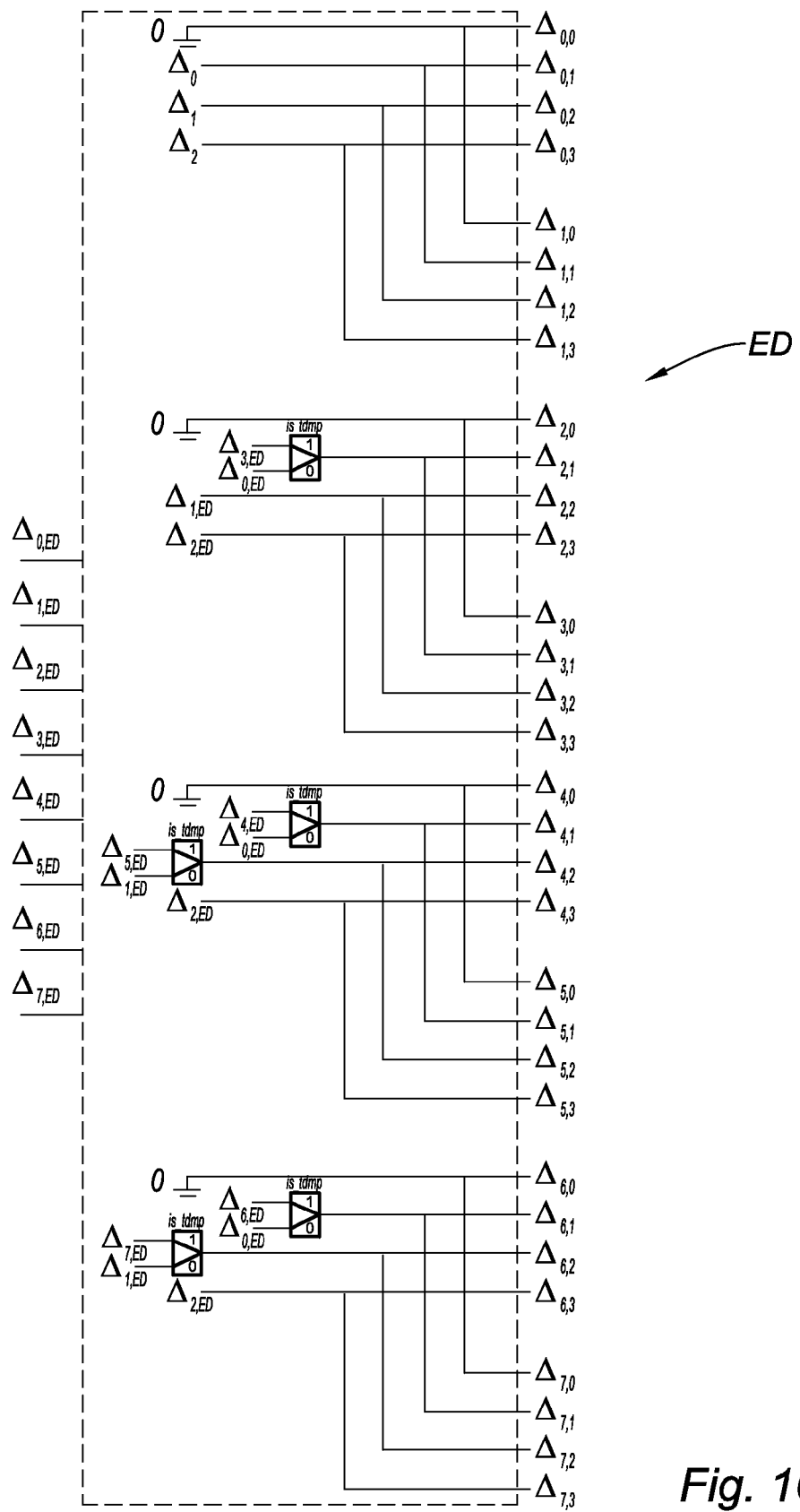

FIG. 16 illustrates an exemplary embodiment of the Extrinsic Distribution block ED which is in charge of producing the proper extrinsic/Soft Output input configuration to the State Metric Recursive Unit SMRU indicated by $\Delta_{i,j}$=0 . . . 7, j=0 . . . 4. Actually 8 data per decoding unit are produced from the P×P permutation network PN2 ($\Delta_{0,ED}$ . . . $\Delta_{7,ED}$) and only the first one ($\Delta_{0,ED}$) is valid in the binary case. On the other hand three values ($\Delta_{0,ED}$, $\Delta_{1,ED}$ and $\Delta_{2,ED}$) are valid in the duo-binary case while all the 8 values must be use in the LDPC case. Note that only five multiplexers are required in this case to provide the proper extrinsic/Soft-Output configuration for all the supported codes. The "is_tdmp" input of the multiplexers is set to 1 when a LDPC has to be processed.

The State Metric Recursive Unit SMRU, performing the forward and backward recursions, has already been described in [11].

Figure 17:
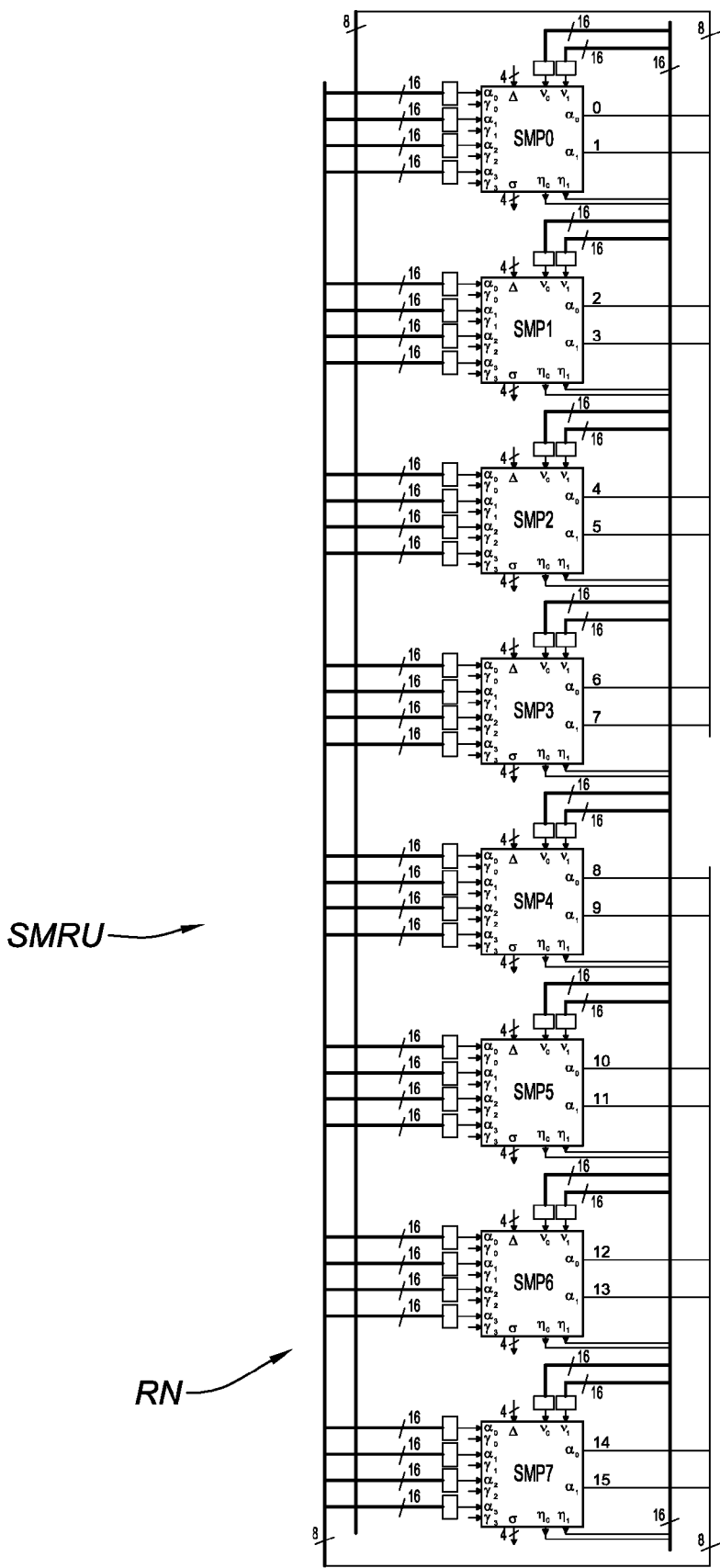

As illustrated on FIG. 17, the unit is composed of v state-metric processors (SMP$_0$-SMP$_{v-1}$) and a multiplexer-based recursion network. When the parameter v is set to the maximum trellis width (number of states) to be supported, the SMA is able to process any trellis width less than v and particularly v two-state trellises (i.e. v check node processing). In the exemplary embodiment of FIG. 18A, v=8.

One or more state-metric processors are used for normalization. In this case, their outputs are equal to zero, and their output norms $n_0$, $n_1$ are distributed to other processors, which receive them through their normalization input ports $v_0$, $v_1$.

Normalization is a known feature of the BCJR algorithm, contributing to its numerical stability.

The recursion network RN represents a key element to achieve flexibility and make the SMRU capable of decoding different families of codes.

In principle, every state-metric input of the generic SMP could be connected to one of the 2v outputs of the SMR unit, and its selection should involve a number of 4v 2v-to-1 multiplexers (32 16-to-1 multiplexer, in the exemplary embodiment). However, an optimal mapping onto the SMP in the SMRU can greatly reduce the size of the feedback multiplexers. This optimization is particularly advantageous in view of the fact that the multiplexers lie in the critical path of the SMRU, and the lower is the number of inputs, the smaller is their propagation delay and so the latency of the unit.

Specifically, when the SMRU supports every 8-state duo-binary, 8-state binary and 2-state binary code and serves both the forward and the backward recursion, the maximum number of inputs of the multiplexers in the feedback network can be reduced to 4. Indeed, as also shown in FIG. 18, out of the 4v=32 state-metric inputs of the SMRU, 18 are driven by 2-to-1 multiplexers, 6 by 3-to-1 multiplexers and 6 by 4-to-1 multiplexers, while 2 inputs are simply hard-wired connected (input 0 of processor 0 and input 1 of processor 7).

FIGS. 18B, 18C and 18D represent the mappings of the states of Turbo-LDPC codes into the SMP's for the exemplary embodiment. The configuration of the recursion network and normalization connections directly depend on this mappings.

They correspond to 8-state duo-binary codes, 8 state binary codes and 2-state binary codes (used for LDPC) respectively.

A multiplexer-based interconnection network is also used to distribute the normalizations signals among the processors in the SMRU. The presence of such a network is justified by the observation that the computation of the normalization metric (associated to the state $S_0$) is mapped on different SMs for different codes, so that a given processor, when acting as a regular processor, can receive its normalization input from different sources. Similarly to the feedback network, the normalization network can be also optimized with an optimum mapping of the state-metric updates onto the SM processors. Particularly, for the support of 8-state duo-binary, 8-state binary and 2-state binary codes, and with the mapping of FIG. 18B-D, only 6 2-to-1 multiplexers are needed, (see FIG. 18A), while the remaining 10 inputs are hard-wired connected to the respective norm processors.

FIG. 19A shows the internal structure of each individual State Metric Processor SMP, in charge of performing the operations of a single state for binary/duo-binary turbo codes and a single check-node update for LDPC codes. As far as the duo-binary processing is concerned (signals not in brackets on FIG. 19A), each state receives exactly four edges, then the max*(max) operation among four elements is performed. Input data to the max*(max) tree are computed by summing the proper forward/backward metrics retrieved at the previous trellis stage with the channel cumulative and extrinsic messages associated to each edge. The "max" operator is simply a comparator, while the "max*" operator can be implemented using a comparator plus a look-up table.

Note that the extrinsic reliabilities Δ must be properly routed depending on the code under decoding through a 4×4 permutation network. Finally the max*(max) tree output is normalized by the output adders so as to reach the final updated forward/backward metric.

Besides the updated forward/backward metrics, this unit also outputs the sum of the input metrics with the channel cumulative messages ($\sigma_0(i)$ . . . $\sigma_3(i)$) which can be directly used within the extrinsic computation. This architecture is also capable of coping with two parallel frames of a binary code (signals in brackets) as, once the multiplexers are switched to "0", two independent data-paths can be identified. Indeed, in a binary code, only two edges are connected to each state thus requiring one single max*(max) operator. Focusing on the LDPC two-state trellis, the same unified SMP with a different output interconnection scheme is used to perform a single check-node update. The detailed architecture is shown in FIG. 19B where two independent sub-processors are identified and used to perform the update described in [14]. In this case the variable-to-check input messages ($\lambda_{b,c}$ or "v2c" for short) are computed as the difference between the Soft-Output $\lambda_b$ (or "SO" for short) and the check-to-variable message $\lambda_{c,b}$ (or "c2v" for short) performed with the second stage of adders.

The State Metric Processors perform first forward metrics $\alpha$ and then backward metrics $\beta$ (or the other way around, it is perfectly equivalent). As both backward and forward metrics are needed to compute extrinsic reliabilities, the latter have to be stored in a State Metric Memory SMM while the processors perform backward recursion.

The single-port State-Metric Memory SMM stores all the metrics of the forward recursion within one single window to be used for the computation of the final a-posteriori extrinsic reliabilities/Soft Output messages.

In the case of binary/duo-binary turbo codes (FIG. 20A), the memory stores 7 metrics per window stage for a maximum of $W_{max} \times 7 = 74 \times 7 = 518$ data.

As far as the LDPC decoding is concerned (FIG. 20B), 8 forward metrics (i.e. the number of trellis processed by SMA) must be stored per trellis stage for a total of $d_{c,max} \times 8 = 22 \times 8 = 176$ metrics. As a result, the memory is arranged into 2 banks of 37 locations, each one containing 7 messages. FIGS. 20A and 20B illustrates the memory filling strategy for the Turbo and LDPC case respectively.

As a final result, considering that each message is represented on 6 bits, the total number of bits required for this memory is:

$$\text{Bit}_{sm} = 12 \times 2 \times 37 \times 7 \times 6 = 37296$$

The forward metrics $\alpha$ and the $\sigma$ computed during backward recursion ($\sigma = \beta + \gamma$) are eventually passed to the Extrinsic Processor EP which updates extrinsic reliabilities $\Delta$ and check-to-variable messages c2v. Before, however, these data are formatted by respective adaptation networks, called State Metric Distribution (SMD) and $\sigma$-Distribution ($\sigma$D) networks.

FIG. 21 shows the state metric distribution architecture which properly routes the data retrieved from the SMM to the EP. As already detailed, the memory comprises two banks whose locations store 7 forward metrics. Focusing on the turbo decoding and according to the filling schedule of FIG. 20A, the required 7 data can be read either from the first or second bank depending on the trellis stage under processing. Consequently the first multiplexing stage of the SMD, properly driven by the control logic CM, is in charge of performing this selection. Finally, the 7 selected forward metrics are replicated and output according to the configuration required by the EP. As far as the LDPC decoding is concerned, the 8 required data are retrieved and selected from memory according to the scheme of FIG. 20B and outputted in the proper configuration through the second stage of multiplexers.

FIG. 22 illustrates the sigma distribution ($\sigma$D) architecture. Actually, while within the turbo decoding the $\sigma$ values produced by the SMRU are already properly ordered for the EP, when an LDPC code is processed ("is_tdmp"=1), data must be rearranged in order to properly evaluate the updated c2v messages.

Figure 23:
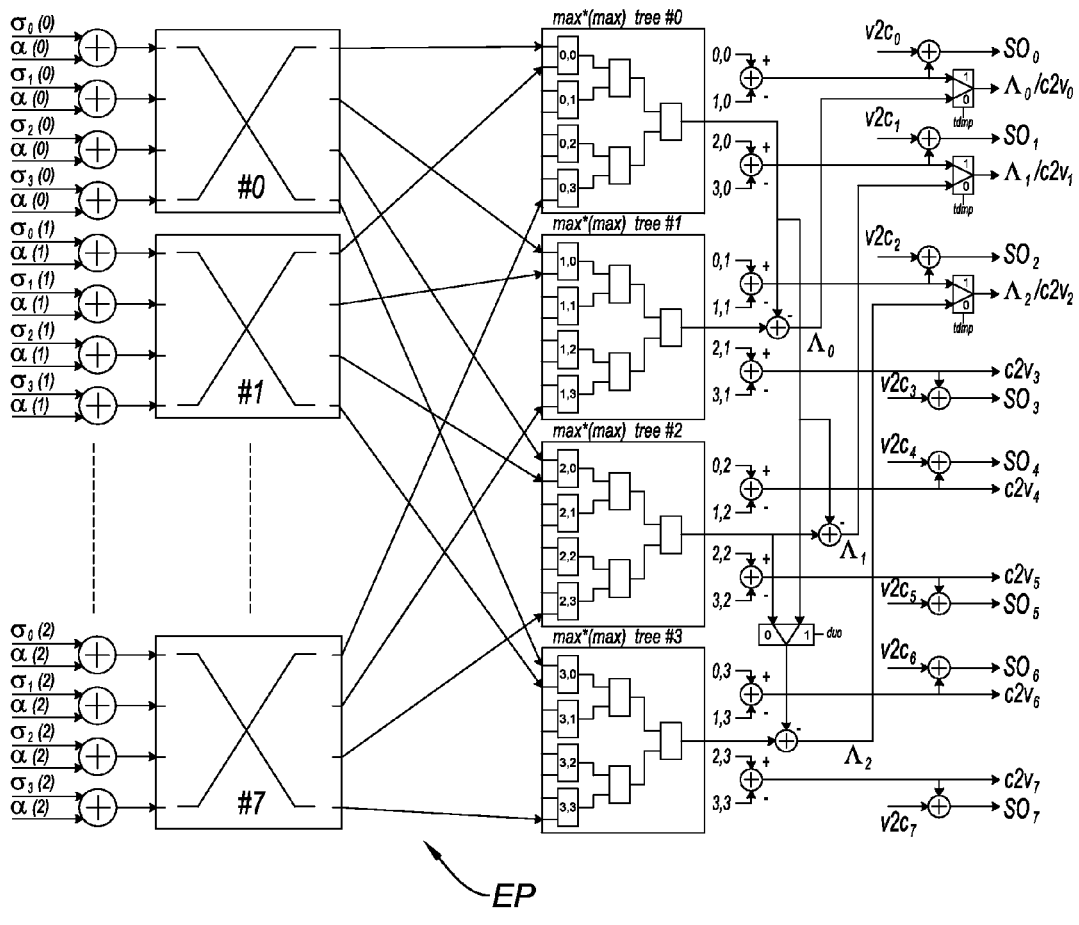

The Extrinsic Processor EP is in charge of producing the updated extrinsic reliabilities for Turbo codes as well as Soft Output and check-to-variable messages for the LDPC case. According to the BCJR data schedule, this block takes as input the forward metrics retrieved from the SMM and the $\sigma$ values computed on-the-fly by the SMUR during the backward recursion (equivalently, it could take as inputs $\alpha$, $\beta$ and $\gamma$, given that $\sigma = \beta + \gamma$). An exemplary embodiment of an EP copying with 8-state trellises is illustrated on FIG. 23.

Let us consider first the duo-binary Turbo case in which three updated extrinsic reliabilities have to be computed. This is accomplished by performing four independent max*(max) operations among the edge metrics labeled with same information symbol and by computing a final normalization. Each max*(max) must be executed among 8 input, and then a three stages tree structure is used. Note that, the support of trellis widths larger than 8 can be easily achieved by adding one or more stages to the max*(max) tree. As far as the edge metrics are concerned, they can be effectively evaluated by using the output $\sigma_0(i), \ldots \sigma_3(i)$ produced by the SMRU during the backward recursion. Actually, while evaluating the backward metric for a certain state $\beta_k(S_i)$, the summation of the backward metrics of each connected states with the related channel cumulative message is carried out, then the metrics related to four edges can be attained by simply adding the forward metric $\alpha_k(S_i)$ retrieved from memory (two equal values are read from memory and then duplicated). The structure of the trellis assures that the four calculated metrics are related to edges labeled with different information symbols, then a 4×4 permutation network is required to deliver the messages to the proper operator. This processing is executed for all the 8 states (extension is straightforward) thus finally achieving the metrics for all the 32 edges of the trellis.

This architecture can also produce the extrinsic reliabilities for two parallel binary frames. Actually, the four edge metrics carried out for each state are related to two different frames (two edge metrics per frame). Each 4×4 permutation network is then configured as two independent crossbar switches, the former feeding the first two max*(max) operators while the latter the remaining ones. Finally, thanks to the output multiplexer (in white on the figure) switched to "0", two independent normalizations are performed to achieve the two final extrinsic reliabilities. Here, "normalization" corresponds to the subtraction in equation (6), and is implemented by the adders (in white on FIG. 23) connected to the outputs of the max* trees.

The support of LDPC decoding is attained thanks to the last two adder stages (in dark gray on the figure). Actually, according to the algorithm defined in [14], the evaluation of the updated check-to-variable messages only involves max* (max) operations between two elements; particularly, the update of 8 metrics in parallel exactly involves 16 max*(max) operation. This computation can be then accomplished by the first stage of max*(max) operators whose output must be then combine with a stage of 8 adders (extension is again straightforward). The architecture produces then 8 check-to-variable metrics ($c2v_i$), and while the last five output are dedicated for the LDPC the first three are shared with the turbo computation thus requiring three additional multiplexers to select the proper data. Finally, the updated check-to-variable metrics ($c2v_i$), before being stored into the M1 memory, are used as input to the last stage of adders to evaluate the Soft-Output metrics according to the layered algorithm [15].

Figure 28:
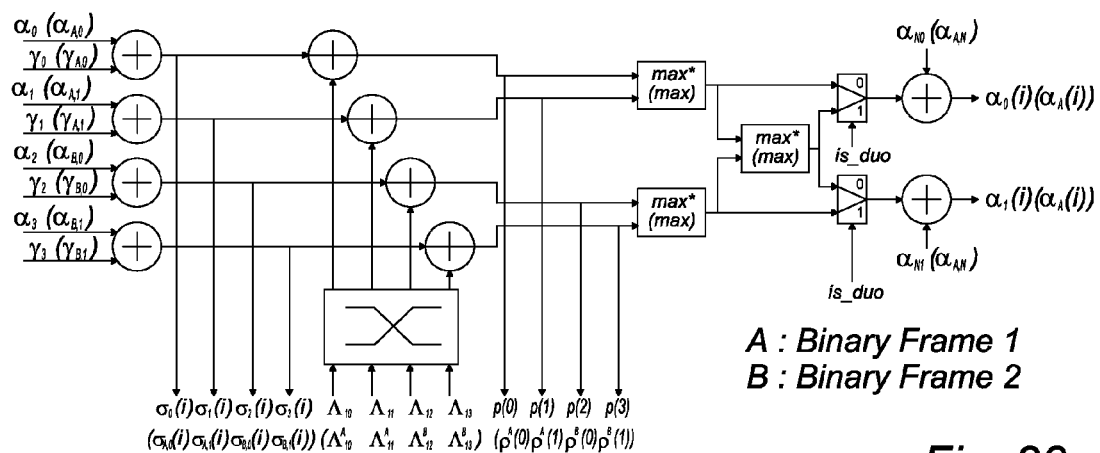
FIGS. 28 and 29, a modified decoding units for processing SCCC Turbo-codes.
Figure 29:
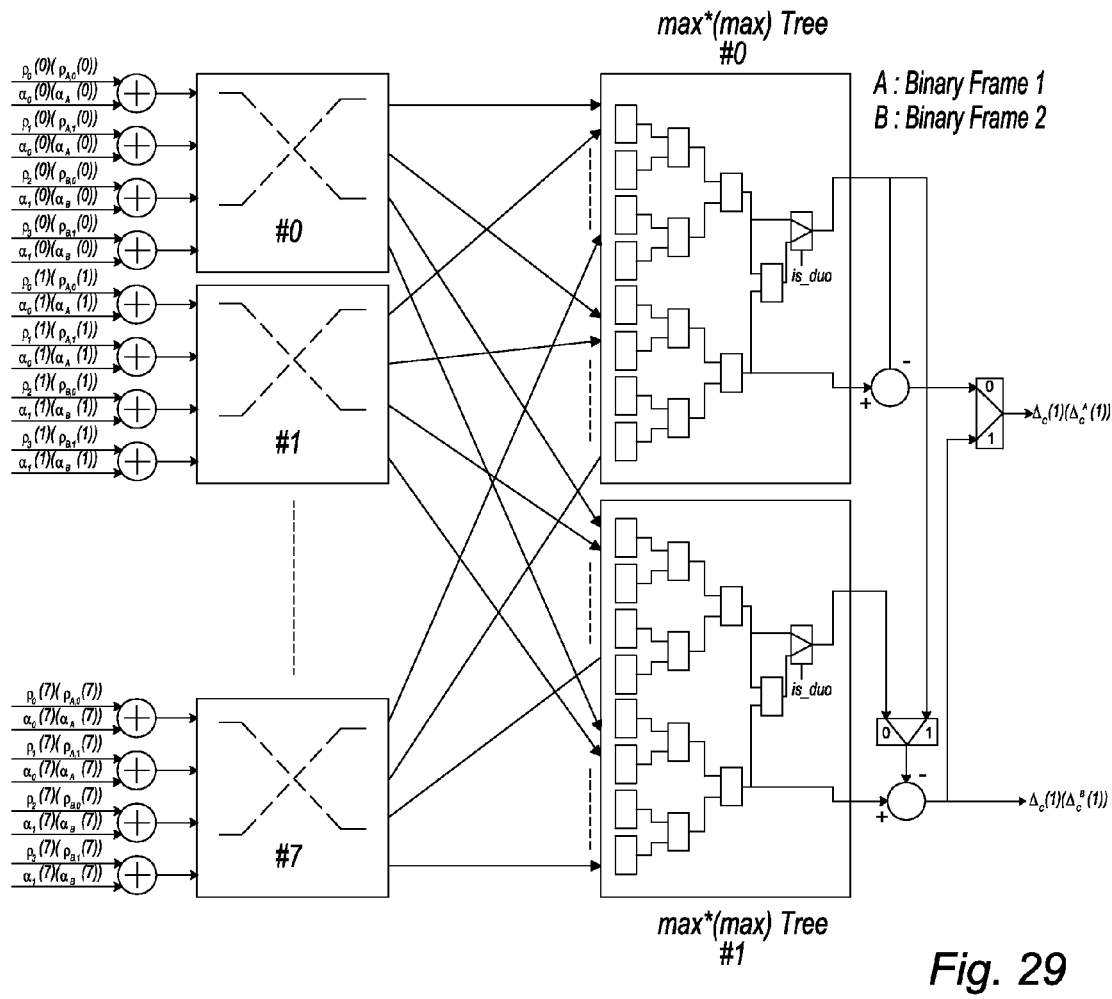

The inventive decoder has been described in detail considering an embodiment suitable for decoding LDPC and PCCC-Turbo codes. However, it can be easily adapted to decode SCCC turbo codes. FIG. 3B shows that the reliability messages exchanged between the two SISO blocks refer to the bits labeled with $v_i$ in FIG. 1c which are actually the interleaved coded bit of the first RSC encoder. Consequently a SISO block for SCCC support, besides the reliabilities of the information symbols ui which are necessary to provide the decoder output, must also evaluate the reliability messages of the coded bits. Again in this case, the BCJR algorithm can be used to calculate these metrics according to Eq. (9). The architecture of FIG. 5 can be then also used for the decoding of SCCC codes, while the internal architecture of each DP must be slightly modified so as to evaluate equation 9. Particularly FIG. 28 shows the modification to be performed on each SMP where a new set of output (ρ) must be envisaged. This is actually necessary as in this case also the reliabilities of the information symbols must be included in the calculation of the reliabilities for the coded bit. Finally, for each coded bit, it is necessary to add, in parallel to the extrinsic processor EP, a network SCCCN whose architecture is shown in FIG. 29. This network takes as inputs the forward metrics previously stored in the SMM and the p metrics generated by the modified SMP's and produces as output the reliability of the considered coded bit. Note that, in the exemplary architecture of FIG. 29, data of two concurrent frames can be processed.

With minimal modification, the inventive decoder is also suitable for decoding non-binary LDPC over GF(q) (i.e. over a Galois field of order "q", "q" being a power of two. These codes are not used by any current standard, but are the object of intense research.

Figure 30:
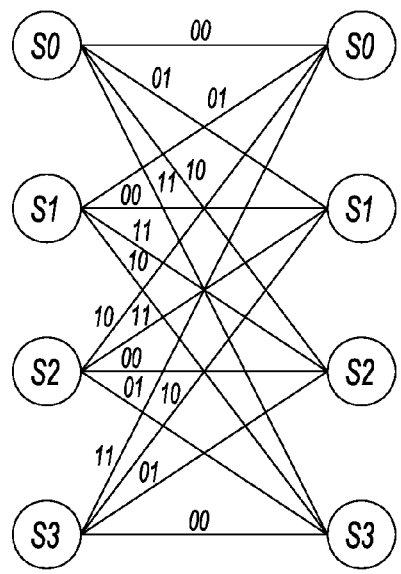
FIG. 30 the trellis of an exemplary non-binary LDPC code over GF(4).

Indeed, each check node constraint, being a parity check equation over a GF(q), can be represented by a q-state trellis with a length equal to the check node degree. An exemplary trellis representing a check node constraints over GF(4) is shown in FIG. 30 where the edge labels represent the product—in GF(4)—of the transmitted symbol involved in the parity check constraint and the corresponding entry—still in GF(4)—of the parity check matrix. The LLR reliability of this product is a vector representing the variable-to-check message. Once generated, the variable to check messages are used as input for the check node processing which, according to the TDMP method, is performed using the BCJR algorithm. Besides this processing over a q-state trellis, the remaining of the TDMP algorithm does not change, except for the fact that a vector of reliabilities (three in the case of GF(4)) must be managed for each single message instead of the only one required by the binary LDPC algorithm. In view of this fact, the flexible LDPC/Turbo architecture of the invention can be easily used to decode non-binary LDPC codes over GF(q). More in detail the SMRU will be in charge of copying with the forward/backward computation of the check node processing; for example considering an embodiment with 8 SMP's, two check node recursions can be performed in parallel for an LDPC code over GF(4). The extrinsic processor will be in charge of evaluating the new c2v and SO vector. The only difference would be in the final two adder stages whose input must be taken from different stages of the max*/max trees. For example in an embodiment supporting LDPC over GF(4) four max*/max operations between four elements must be envisaged per each check node, then the adder of the two last stages must be fed by the second stage of the max/max* tree. More in general it is straightforward to add a small adaptation network to manage different LDPC code over different GF(q) by selecting the most suitable input for the adders evaluating the c2v and SO messages.

The rest of the decoder will basically remain unchanged. Note also that the permutation networks PN1(PN2) can be used to evaluate the product over GF(q) of the reliabilities associated to the transmitted bits and the non-zero entries in the parity check matrix, because in GF(q) this product is simply a q×q permutation.

The characterization of the architecture described here (FIGS. 5-26), implemented as an ASIC, has been carried-out through logical synthesis on a 45 nm standard-cell CMOS technology with high-density of integration (CMOS-45HD) and a supply voltage of 0.95V. This library is particularly suitable for mobile application as it guarantees an high level of optimization in terms of area (high-density process) and power consumption (low-leakage transistors).

The operating clock frequency has been set to 150 MHz which guarantees the strict throughput constraints to be met with reduced dynamic power consumption.

Table II reports the complexity breakdown of the logic resources for an overall occupied area of 0.45 mm2. Particularly, the most area demanding blocks are the 12 instances of the SMRU which counts for the 35% of the overall complexity. Furthermore it is important to note that the support of different coding schemes (LDPC and Turbo codes) results in a considerable contribution of the control unit (CM) to the logic complexity (20.3%).

TABLE II

| Block | # units | Unit Area ($\mu m^2$) | Area ($\mu m^2$) | Weight |
|---|---|---|---|---|
| CCC | 12 | 691 | 8202 | 1.8% |
| CCD | 96 | 482 | 46272 | 10.3% |
| CMD | 1 | 91480 | 91480 | 20.3% |
| EP | 12 | 8018 | 96216 | 21.4% |
| SMRU | 12 | 13407 | 160884 | 35.8% |
| PN1 | 1 | 2471 | 2471 | 0.5% |
| PN2 | 1 | 13020 | 13020 | 2.9% |
| Interfaces & glue logic | 1 | 31365 | 31365 | 7% |
| Total | | | 0.45 mm$^2$ | |

Table III details the breakdown complexity related to the memory blocks. As expected the M1 memory plays a major role (≈69% of the total area) as it contains five channel reliabilities per information bit in the worst case code (DVB-SH K=12282). Finally it is important to note that, thanks to the proper memory arrangement and filling strategy described above and to the hybrid Multi-SISO/Multi-MAP architecture it was possible to optimize the memory complexity which results roughly equal to the logic area.

TABLE III

| Block | # banks | Bit per bank | Tot. Area ($\mu m^2$) | Weight |
|---|---|---|---|---|
| M2 | 96 | 768 | 76800 | 16.9% |
| TB-M2 | 108 | 150 | 20250 | 4.5% |
| M1 | 24 | 12800 | 313470 | 68.9% |
| SMM | 24 | 1554 | 44400 | 9.7% |
| Total | | | 0.45 mm$^2$ | |

The power consumption of the implemented channel decoding platform has been estimated in the worst case condition, which applies when the decoder runs the maximum number of iterations with all the 12 data-paths activated. Table IV reports the results in terms of Dynamic and Static Power consumption, showing that, although the complexity are comparable, the memory power consumption is much higher than the logic one (almost doubled). Note that the low total power consumption of 86.1 maw is attained thanks to the low operating clock frequency which considerably reduces the dynamic power consumption. Finally, in view of the stopping rules implementation, it is possible to further reduce the power during the decoding processing depending on the channel conditions and data-paths required.

TABLE IV

| Block | Dynamic Power (mW) | Static Power (mW) | Total Power (mw) |
|---|---|---|---|
| Logic | 31.3 | 0.2 | 31.5 |
| Memories | 54 | 0.6 | 54.6 |
| Total | | | 86.1 mW |

Table V shows a comparison with the prior art designs of [5], [6] and [8]. In order to have a technology independent complexity parameter (equivalent gate) the reported area values have been normalized to the area of the NAND2 gate for the related technology. These values are 0.99 μm², 2.06 μm² and 4.39 μm² for the 45 nm, 65 nm and 90 nm technology respectively. As far as the power consumption is concerned a technology independent value has been considered as it follows:

$$PW\text{-norm} = P_{(MHz, Kgates)} \cdot f_{clk} \cdot A$$

where $f_{clk}$ is the operating clock frequency, A is the complexity in Kgates and $P_{(MHz, Kgates)}$ is the power consumption of the inventive decoder normalized to the complexity and clock frequency:

$$P_{(MHz, Kgates)} = 86.1/(150 \cdot 900) = 638 \cdot 10^{-6} \text{ W/(Kgates} \cdot \text{MHz)}$$

Design in [8] seems to outperform the inventive decoder in terms of complexity, but, although a unified approach is described, the results are given only for single standard solutions. Thus a certain overhead must be added in view of a multi-standard implementation of such a design. Furthermore the architecture is highly inefficient in terms of power consumption especially due to the very high clock frequency. Consequently the suitability to the integration into a mobile device must be carefully assessed.

The ASIP solution proposed in [5] features an extremely low complexity with a power consumption lower than our solution by 10%. Although these astonishing figures, the very important drawback of this architecture is that it is not fully compliant with the throughput requirements defined by the communication standards to be supported; more particularly, the required throughput for IEEE 802.16e (WiMAX) is not met. Actually the maximum achievable throughput (with only 5 iterations) for the duo-binary IEEE 802.16e Turbo codes is declared to be at maximum 37.2 Mbps which is well below the requirement of the standard (70 Mbps). Consequently, the architecture as it is cannot be used within a device supporting the above-mentioned standard. A solution to the problem could be for example, either increasing the operating clock frequency or adding new hardware resources, thus consequently increasing the complexity and making the architecture inefficient in terms of power consumption.

TABLE V

| | This work | [8] | [5] | [6] |
|---|---|---|---|---|
| Design | ASIC | ASIC | ASIP | ASIP |
| Multi-Standard | YES | NO | YES | YES |
| Technology | 45 nm | 90 nm | 65 nm | 45 nm |
| Clock Frequency (MHz) | 150 | 500 | 400 | 333 |
| Throughput met | YES | YES | NO | YES |
| Complexity (Kgates) | 900 | 514 | 301 | 940 |
| PW-norm (mW) | 86.1 | 163.9 | 76.8 | 199.6 |

A complete and fair comparison can be indeed performed with the ASIP design of [6] which is a multi-standard decoder fully compliant with the supported standards in terms of throughput. As it is shown from tab. V, the present invention outperforms such an ASIP architecture both in terms of complexity and power consumption.

REFERENCES

[1]: G. Masera, F. Quaglio, and F. Vacca "Implementation of a flexible LDPC decoder", 54(6):542-546, June 2007.

[2] Hye-Jin Ryu Jong-Yeol Lee "A 1-Gb/s flexible LDPC decoder supporting multiple code rates and block lengths", IEEE Trans. Consumer Electron., 54:417-424, May 2008.

[3] M. Martina, M. Nicola, and G. Masera "A flexible umts-wimax turbo decoder architecture", IEEE Transaction on Circuit and System, Express Briefs, 55(4):369-373, April 2008.

[4] In-Cheol Park Ji-Hoon Kim "A unified parallel radix-4 turbo decoder for mobile WiMAX and 3GPP-LTE", IEEE Custom Integrated Circuits Conference, CICC '09, pages 487-490, September 2009.

[5] M. Alles, T. Vogt, and N. When "FlexiChaP: A reconfigurable ASIP for convolutional, turbo, and LDPC code decoding", IEEE 5th International Symposium on Turbo Codes and Related Topics, pages 84-89, September 2008.

[6] F. Naessens, B. Bougard, S. Bressinck, L. Hollevoet, P. Raghavan, L. Van Der Perre, and F. Catthoor "A unified instruction set programmable architecture for multi-standard advanced forward error correction", IEEE Workshop on Signal Processing Systems, SiPS 2008, pages 31-36, October 2008.

[7] WO 2009/043918

[8] Sun Yang and J. R. Cavallaro "Unified decoder architecture for LDPC/turbo codes", IEEE Workshop on Signal Processing Systems, SiPS 2008, pages 13-18, October 2008.

[9] WO 2008/153436

[10] M. Rovini, G. Gentile, and L. Fanucci, "A flexible state-metric recursion unit for a multi-standard BCJR decoder," 2009 3rd International Conference on Signals, Circuits and Systems (SCS), 11 2009, pp. 1-6.

[11] M. Rovini, G. Gentile, and L. Fanucci "Multi-size circular shifting networks for decoders of structured LDPC codes", IET Electr. Lett., 43(17):938-940, August 2007.

[12] A. Tarable, S. Benedetto, and G. Montorsi "Mapping interleaving laws to parallel turbo and ldpc decoder architectures", IEEE Transaction on Information Theory, 50(9): 2002-2009, September 2004.

[13] T. Brack, M. Alles, F. Kienle, and N. When "A synthesizable IP core for WiMAX 802.16e LDPC code decoding", 17th IEEE Intern. Symp. on Personal, Indoor and Mobile Communic., pages 1-5, September 2006.

[14] G. Gentile, M. Rovini, and L. Fanucci "Low-complexity architectures of a decoder for IEEE 802.16e LDPC codes", 10th Euromicro Conference on Digital System Design (DSD), August 2007.

[15] IEEE Standard for information technology—Telecommunications and information exchange between systems—Local and metropolitan area networks. Part 11 Wireless LAN Medium Access Control (MAC) and Physical Layer (PHY) Specifications. Amendment 5: Enhancement for Higher throughput, November 2009.

The invention claimed is:

1. A configurable Turbo-Low Density Parity Check (LDPC) decoder comprising:

A set of P>1 Soft-Input-Soft-Output decoding units ($DP_0$-$DP_{P-1}$; $DP_i$) for iteratively decoding both Turbo- and LDPC-encoded input data, each of said decoding units having first ($I_1^i$) and second ($I_2^i$) input ports and first ($O_1^i$) and second ($O_2^i$) output ports for intermediate data;

First and second memories (M1, M2) for storing said intermediate data, each of said first and second memories comprising P independently readable and writable memory blocks having respective input and output ports; and A configurable switching network (SN) for connecting the first input and output ports of said decoding units to the output and input ports of said first memory, and the second input and output ports of said decoding units to the output and input ports of said second memory, wherein each of said P>1 Soft-Input-Soft-Output decoding units ($DP_0$-$DP_{P-1}$; $DP_i$) has:

a first input port ($I_1^i$) for input reliabilities ($\lambda$) used in Turbo-decoding, and for check-to-variable metrics (c2v) used in LDPC-decoding;

a second input port ($I_2^i$) for extrinsic reliabilities ($\Lambda$) used in Turbo-decoding and for intermediate soft outputs (SO) used for LDPC-decoding;

a first output port ($O_1^i$) for check-to-variable metrics updated during LDPC-decoding; and a second output port ($O_2^i$) for extrinsic reliabilities obtained as intermediate or final results of Turbo-decoding, and for soft outputs obtained as intermediate or final results of LDPC-decoding; and said configurable switching network comprises:

A first and second P×P permutation network (PN1, PN2);

A P×P circular switching network (PSN);

First switching means (SW1) connecting the input ports of said first memory with either the first output ports of said decoding units or with a first input port (ID1) of the Turbo-LDPC decoder;

Second switching means (SW2) connecting the input ports of said second memory with either the second output ports of said decoding units through said first P×P permutation network, or with a second input port (ID2) of the Turbo-LDPC decoder;

Third switching means (SW3) connecting the output ports of said first memory with the first input ports of said decoding units either directly or through said P×P circular switching network; and Fourth switching means (SW4) connecting the output ports of said first memory with either the second input ports of said decoding units through said second P×P permutation network, or with an output port (OD) of the Turbo-LDPC decoder.

2. The configurable Turbo-LDPC decoder according to claim 1 also comprising control means (CM) for driving said switching network and said decoding units in order to selectively implement:

simultaneous decoding of several Turbo-encoded frames by at least some of said P decoding units;

parallelized decoding of a single Turbo-encoded frame by at least some of said P decoding units; and parallelized decoding of a single LDPC-encoded frame by at least some of said P decoding units, each processing one or more parity-check constraints.

3. The configurable Turbo-LDPC decoder according to claim 1 also comprising control means (CM) for driving said first and second permutation network, said circular switching network, said first, second, third and fourth switching means and said decoding units in order to selectively implement:

simultaneous decoding of several Turbo-encoded frames by at least some of said P decoding units, whose first input ports are connected to the output ports of said first memory through said circular switching network, the Turbo-encoded frames to be decoded being received through said first input port of the decoder and stored in said first memory;

parallelized decoding of a single Turbo-encoded frame by at least some of said P decoding units, each processing a portion of a code trellis, whose first input ports are directly connected to the output ports of said first memory, the Turbo-encoded frames to be decoded being received through said first input port of the decoder and stored in said first memory; or parallelized decoding of a single LDPC-encoded frame by at least some of said P decoding units, each processing one or more parity-check constraints, the LDPC-encoded frames to be decoded being received through said second input port of the decoder and stored in said second memory.

4. The configurable Turbo-LDPC decoder according to claim 1 wherein said first and second memories are single-port memories, respective temporary buffers being provided to avoid read/write collisions.

5. The configurable Turbo-LDPC decoder according to claim 1 wherein said decoding units are adapted for performing Turbo- and LDPC-decoding using a BCJR (Bahl, Cocke, Jelinek and Raviv), or forward-backward, algorithm.

6. The configurable Turbo-LDPC decoder according to claim 5 wherein said decoding units are adapted for performing LDPC-decoding using a TDMP algorithm.

7. The configurable Turbo-LDPC decoder according to claim 1 comprising a number P of decoding units comprised between 4 and 16.

8. The configurable Turbo-LDPC decoder according to claim 1 comprising means for switching off or on part of the decoding units and of the memory blocks of said first and second memory depending on a required decoding throughput.

9. The configurable Turbo-LDPC decoder according to claim 1 wherein each of said decoding units comprises a single processing core for both Turbo- and LDPC-decoding.

10. The configurable Turbo-LDPC decoder according to claim 9 wherein each of said decoding units ($DP_i$) comprises the following functional blocks:

A by-passable channel cumulative computation unit (CCC) for computing channel cumulative messages ($\gamma$) by adding-up input reliabilities;

A state-metric recursive unit (SMRU) for successively performing recursive computation of forward ($\alpha$) and backward ($\beta$) metrics, taking said channel cumulative messages ($\gamma$) as inputs;

A state-metric memory (SMM) for storing already-computed forward metrics while the state-metric recursive unit is computing backward metrics, or vice-versa; and An extrinsic reliabilities processor (EP) for computing extrinsic reliabilities ($\Lambda$), for Turbo-decoding, and soft outputs and check-to-variable metrics (c2v), for LDPC decoding, taking said forward metrics, backward metrics and channel cumulative messages as its inputs.

11. The configurable Turbo-LDPC decoder according to claim 10 wherein each of said decoding units also comprises configurable distribution networks (CMD, CCD, ED, SMD, aD) for transferring data from the input ports of the decoding units to its functional blocks, and between said functional blocks, according to different data formats and decoding algorithms.

12. The configurable Turbo-LDPC decoder according to claim 10 wherein the extrinsic reliabilities processor of each decoding unit comprises:

input ports for receiving forward ($\alpha$), backward ($\beta$) and channel cumulative messages ($\gamma$), or combinations thereof ($\sigma$), corresponding to different trellis edges;

a first stage of adders, for adding forward, backward and channel cumulative messages corresponding to a same trellis edge;

a number $2^M$ of max* or max trees equal to the number of said alphabet symbols;

a number K of $2^M \times 2^M$ permutation networks equal to the number of said trellis states, connecting output ports of said adders to input ports of said max* or max trees, wherein each of said max* or max trees has K input ports, each one being connected to a different one of said permutation networks;

a third stage of adders for computing extrinsic reliabilities ($\Lambda$) as sums of outputs of said max* or max trees; and fourth and fifth stages of adders for computing updated check-to-variable metrics (c2v) and LDPC-soft outputs (SO) by combining input and outputs of first stages of said max* or max trees.

13. The configurable Turbo-LDPC decoder according to claim 10 wherein the state-metric recursive unit (SMRU) of each decoding unit comprises a plurality of state metric processors (SMP0-SMP7) for computing forward and backward metrics of respective states of a code trellis, interconnected by a configurable recursion network.

14. The configurable Turbo-LDPC decoder according to claim 13 wherein each said state metric processor comprises:

first input ports for receiving, through said recursion network (RN), forward ($\alpha$)/backward ($\beta$) metrics;

second input ports for receiving channel cumulative messages ($\gamma$) corresponding to different edges reaching a same state of a code trellis;

a first stage of adders, for adding forward/backward and channel cumulative messages corresponding to a same trellis edge;

third input ports for receiving a posteriori reliabilities ($\Lambda$)/Soft-outputs (SO);

a second stage of adders, for adding said a posteriori reliabilities to the sums performed by the adders of said first stages;

a max* or max tree taking as inputs the sums computed by the adders of said second stage; and first output ports for updated values of said forward/backward metrics.

15. The configurable Turbo-LDPC decoder according to claim 13 wherein each said state metric processor further comprises second output ports for the sums (a) of forward/backward and channel cumulative messages corresponding to a same trellis edge.

16. The configurable Turbo-LDPC decoder according to claim 1, implemented as an Application Specific Integrated Circuit.

17. An extrinsic reliability processor for computing extrinsic reliabilities in Turbo-decoding, and soft outputs and check-to-variable metrics, in Low Density Parity Check (LDPC) decoding, having input ports for forward metrics, backward metrics and channel cumulative messages corresponding to different trellis edges:

a first stage of adders, for adding forward, backward and channel cumulative messages corresponding to a same trellis edge;

a number $2^M$ of max* or max trees equal to the number of said alphabet symbols;

a number K of $2^M \times 2^M$ permutation networks equal to the number of said trellis states, connecting output ports of said adders to input ports of said max* or max trees, wherein each of said max* or max trees has K input ports, each one being connected to a different one of said permutation networks;

a third stage of adders for computing extrinsic reliabilities as sums of outputs of said max* or max trees; and fourth and fifth stages of adders for computing updated check-to-variable metrics and LDPC-soft outputs by combining input and outputs of first stages of said max* or max trees.

\* \* \* \* \*